(12) United States Patent
Miyake et al.

(10) Patent No.: US 9,190,448 B2
(45) Date of Patent: Nov. 17, 2015

(54) IMAGING DEVICE AND OPERATION METHOD THEREOF

(71) Applicant: SEMICONDUCTOR ENERGY LABORATORY CO., LTD., Atsugi-shi, Kanagawa-ken (JP)

(72) Inventors: Hiroyuki Miyake, Kanagawa (JP); Hideaki Shishido, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/446,911

(22) Filed: Jul. 30, 2014

(65) Prior Publication Data

US 2015/0034831 A1    Feb. 5, 2015

(30) Foreign Application Priority Data

Aug. 2, 2013 (JP) .................. 2013-161035

(51) Int. Cl.
*G01T 1/24*    (2006.01)
*H01L 27/146*    (2006.01)
*H04N 5/32*    (2006.01)

(52) U.S. Cl.
CPC .... *H01L 27/14659* (2013.01); *H01L 27/14603* (2013.01); *H01L 27/14609* (2013.01); *H01L 27/14663* (2013.01); *H04N 5/32* (2013.01)

(58) Field of Classification Search
CPC .................. H01L 27/14603; H01L 27/14663; H01L 27/14659; G01T 1/2018; G01T 1/247
USPC ......................................... 250/369
See application file for complete search history.

(56) References Cited

U.S. PATENT DOCUMENTS

| 5,530,238 | A | * | 6/1996 | Meulenbrugge et al. .. 250/208.1 |
| 5,731,856 | A | | 3/1998 | Kim et al. |
| 5,744,864 | A | | 4/1998 | Cillessen et al. |

(Continued)

FOREIGN PATENT DOCUMENTS

| EP | 1737044 A | 12/2006 |
| EP | 22268447 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Marcus Taningco
(74) *Attorney, Agent, or Firm* — Nixon Peabody LLP; Jeffrey L. Costellia

(57) ABSTRACT

Provided is an imaging device that can correct an output value of a pixel circuit. The imaging device includes a pixel circuit, a current detection circuit, an A/D converter, one or more memory circuit portions, and an arithmetic circuit portion. The pixel circuit includes a transistor, a charge accumulation portion, and a light-receiving element. The memory circuit portion includes a first look-up table, a second look-up table, and a region where image data output from the arithmetic circuit portion is stored. The first look-up table stores data of potentials of the charge accumulation portion, which depends on the intensity of light. The second look-up table stores output data of the transistor, which depends on the potentials of the charge accumulation portion.

27 Claims, 20 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,193,031 B2 | 6/2012 | Hosoba et al. |
| 8,207,014 B2 | 6/2012 | Sasaki et al. |
| 8,470,650 B2 | 6/2013 | Akimoto et al. |
| 8,546,180 B2 | 10/2013 | Yamazaki et al. |
| 8,624,237 B2 | 1/2014 | Yamazaki et al. |
| 2001/0046027 A1 | 11/2001 | Tai et al. |
| 2002/0056838 A1 | 5/2002 | Ogawa |
| 2002/0093581 A1 | 7/2002 | Ikeda et al. |
| 2002/0132454 A1 | 9/2002 | Ohtsu et al. |
| 2003/0047785 A1 | 3/2003 | Kawasaki et al. |
| 2003/0185342 A1* | 10/2003 | Petrick et al. ............. 378/98.8 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0283049 A1 | 11/2010 | Sato et al. |
| 2010/0304529 A1 | 12/2010 | Sasaki et al. |
| 2011/0305382 A1* | 12/2011 | Takahashi ............ 382/132 |
| 2012/0082295 A1* | 4/2012 | Agano et al. ............ 378/62 |
| 2012/0273780 A1 | 11/2012 | Yamazaki et al. |
| 2012/0280230 A1 | 11/2012 | Akimoto et al. |
| 2013/0068952 A1* | 3/2013 | Kuwabara ............ 250/366 |
| 2013/0140464 A1* | 6/2013 | Iwakiri et al. ............ 250/366 |
| 2014/0054466 A1 | 2/2014 | Kurokawa et al. |
| 2014/0056405 A1 | 2/2014 | Kurokawa et al. |
| 2014/0070079 A1 | 3/2014 | Kurokawa et al. |
| 2014/0239183 A1 | 8/2014 | Yamazaki et al. |
| 2014/0374745 A1 | 12/2014 | Takahashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-164067 | 6/1990 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-151669 | 5/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

(56) References Cited

OTHER PUBLICATIONS

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp.165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,Yb2Fe2O4, and YbFe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent Am-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

210

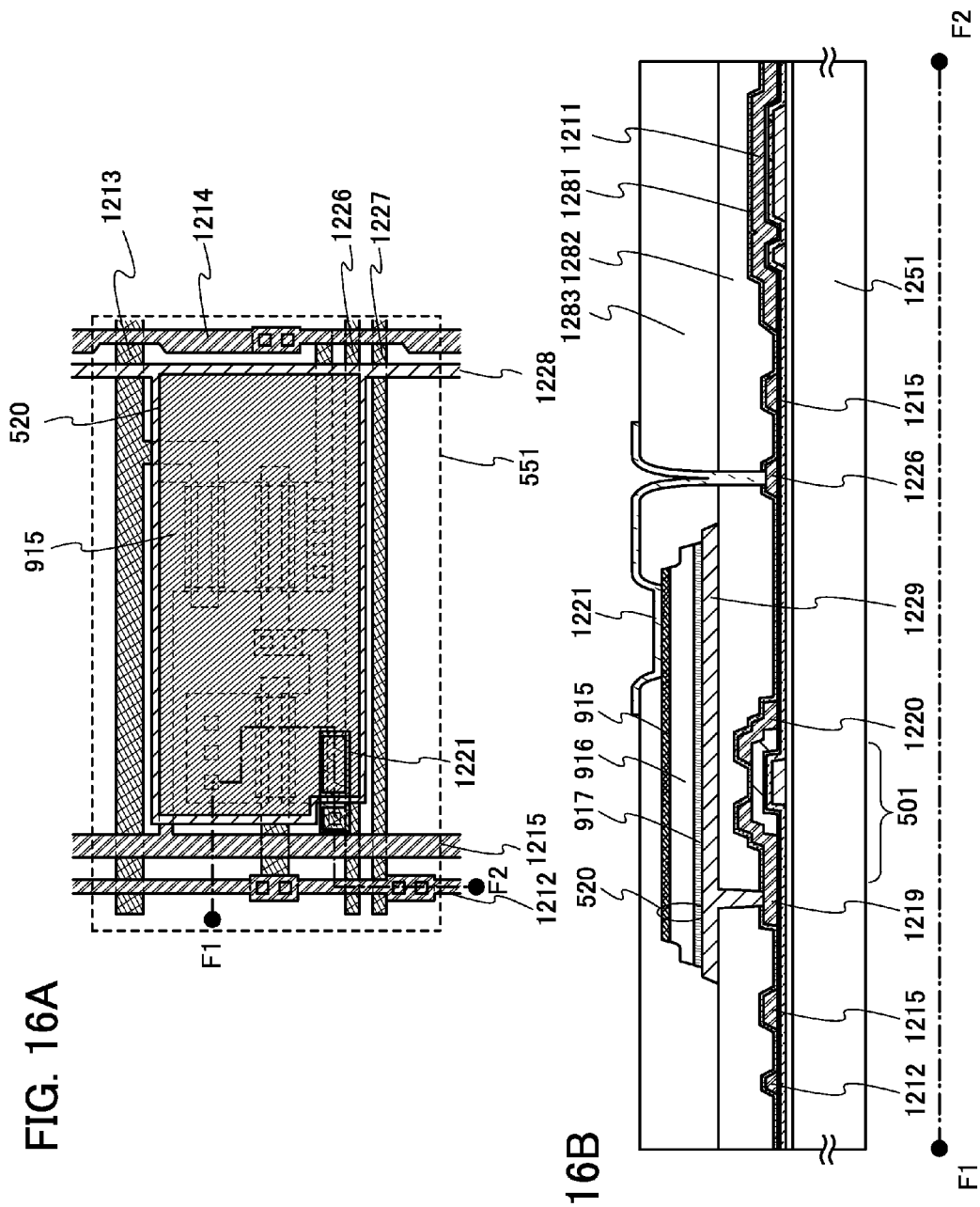

IMAGING DEVICE AND OPERATION METHOD THEREOF

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, an imaging device, a driving method thereof, or a manufacturing method thereof. One embodiment of the present invention particularly relates to an imaging device including a scintillator.

2. Description of the Related Art

In medical practice, a medical diagnostic imaging device using a photographic technique has been in wide use. With the medical diagnostic imaging device, a specific portion of a patient is irradiated with X-rays, an X-ray film is exposed to X-rays that have passed through the specific portion, and the X-ray film is developed to visualize a state inside the specific portion.

Since the method using X-ray films needs a storage space for the X-ray films and maintenance thereof is troublesome, digitization of images is in progress. As a method for digitizing images, a method using an imaging plate is known. An imaging plate is irradiated with X-rays in a manner similar to that of the X-ray films and light emitted from the imaging plate is sensed with a scanner; thus, digitized images can be obtained.

The imaging plate is a plate to which a material having a property of emitting light by X-ray irradiation (this property is referred to as photostimulability, and the material having this property is referred to as a photostimulable phosphor) is applied and has higher detection sensitivity to X-ray absorption difference than an X-ray film does. In addition, data of X-ray irradiation can be erased, so that the imaging plate can be re-used. However, the data obtained by the imaging plate is analog, so that digitization treatment to digitize the data is necessary.

For this reason, attention has been recently focused on flat panel detectors capable of obtaining digital data directly (e.g., Patent Documents 1 and 2). Flat panel detectors have two types of systems, direct and indirect conversion systems. In the direct conversion system, X-rays are directly converted to electrical charges with the use of an X-ray detecting element. In the indirect conversion system, X-rays are converted to visible light with a scintillator and the light is converted to electrical charges by a photodiode. In either of the systems, a flat panel detector includes a plurality of pixel circuits arranged in a matrix.

REFERENCE

Patent Document

[Patent Document 1] Japanese Published Patent Application No. H2-164067
[Patent Document 2] Japanese Published Patent Application No. 2002-151669

SUMMARY OF THE INVENTION

A semiconductor material or an insulating material is included in transistors of the pixel circuits in the flat panel detector. When the semiconductor material or the insulating material is irradiated with radial rays having strong energy such as X-rays, defect states and the like are generated, so that electrical characteristics of the transistors are changed.

This might occur by slight amount of radiation that has passed through a photoelectric conversion material or a scintillator. As a result, the reliability of data acquired in the flat panel detector is decreased.

In view of the above, one object of one embodiment of the present invention is to provide an imaging device that corrects an output value of a pixel circuit. Another object is to provide an imaging device that stores a program for controlling an operation of reading the electric characteristics of a transistor included in a pixel circuit. Another object is to provide a novel imaging device or the like. Another object is to provide an operation method of an imaging device that corrects an output value of a pixel circuit. Another object is to provide an operation method of an imaging device that reads the electric characteristics of a transistor included in a pixel circuit. Another object is to provide an operation method of a novel imaging device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging device that includes a transistor using an oxide semiconductor in a pixel circuit and takes an image with radial rays such as X-rays, and an operation method of the imaging device.

One embodiment of the present invention is an imaging device including a pixel circuit, a current detection circuit, an A/D converter, one or more memory circuit portions, and an arithmetic circuit portion. The pixel circuit includes a transistor, a charge accumulation portion, and a light-receiving element. The memory circuit portion includes a first look-up table, a second look-up table, and a region where image data output from the arithmetic circuit portion is stored. The first look-up table stores data of potentials, which are supplied from the light-receiving element and accumulated in the charge accumulation portion, corresponding to different levels of illuminance. The second look-up table stores output data of a transistor whose gate is electrically connected to the charge accumulation portion, which have passed through the current detection circuit and the A/D converter and which correspond to different potentials supplied to the charge accumulation portion.

Note that in this specification and the like, ordinal numbers such as "first" and "second" are used in order to avoid confusion among components and do not limit the components numerically.

The memory circuit portion may store a program for acquiring data of the second look-up table.

The pixel circuit may include a first transistor, a second transistor, and a third transistor, and have the following configuration: one of a source and a drain of the first transistor is electrically connected to one electrode of the light-receiving element; the other of the source and the drain of the first transistor is electrically connected to the charge accumulation portion; a gate of the second transistor is electrically connected to the charge accumulation portion; one of a source and a drain of the second transistor is electrically connected to one of a source and a drain of the third transistor; the other of the source and the drain of the second transistor is electrically connected to a first wiring; the other of the source and the drain of the third transistor is electrically connected to a second wiring; a gate of the first transistor is electrically connected to a third wiring; a gate of the third transistor is electrically connected to a fourth wiring; the other electrode of the light-receiving element is electrically connected to a fifth wiring; and the current detection circuit is electrically connected to the second wiring.

The transistor included in the pixel circuit is preferably formed using an oxide semiconductor.

The second look-up table can store output values from the second transistor, which have passed through the current detection circuit and the A/D converter and which correspond to different potentials supplied from the fifth wiring to the charge accumulation portion through the light-receiving element and the first transistor.

Owing to the program, the first transistor and the third transistor can be turned on and different potentials can be supplied to the fifth wiring, so that the output values can be acquired from the second transistor, which have passed through the current detection circuit and the A/D converter and which correspond to the different potentials.

The pixel circuit may include a first transistor, a second transistor, a third transistor, and a fourth transistor, and have the following configuration: one of a source and a drain of the first transistor is electrically connected to one electrode of the light-receiving element; the other of the source and the drain of the first transistor is electrically connected to the charge accumulation portion; a gate of the second transistor is electrically connected to the charge accumulation portion; one of a source and a drain of the second transistor is electrically connected to one of a source and a drain of the third transistor; one of a source and a drain of the fourth transistor is electrically connected to the charge accumulation portion; the other of the source and the drain of the second transistor is electrically connected to a first wiring; the other of the source and the drain of the third transistor is electrically connected to a second wiring; the other of the source and the drain of the fourth transistor is electrically connected to a seventh wiring; a gate of the first transistor is electrically connected to a third wiring; a gate of the third transistor is electrically connected to a fourth wiring; a gate of the fourth transistor is electrically connected to a fifth wiring; the other electrode of the light-receiving element is electrically connected to a sixth wiring; and the current detection circuit is electrically connected to the second wiring.

The transistor included in the pixel circuit is preferably formed using an oxide semiconductor.

The second look-up table can store output values from the second transistor, which have passed through the current detection circuit and the A/D converter and which correspond to different potentials supplied from the seventh wiring to the charge accumulation portion.

Owing to the program, the third transistor and the fourth transistor can be turned on and different potentials can be supplied to the seventh wiring, so that the output values can be acquired from the second transistor, which have passed through the current detection circuit and the A/D converter and which correspond to the different potentials.

In the imaging device, a scintillator can be over the light-receiving element.

As the light-receiving element, a photodiode or a variable resistive element including a semiconductor layer between a pair of electrodes can be used.

The arithmetic circuit portion can execute the program before imaging to acquire data of the second look-up table, read a potential of the charge accumulation portion corresponding to an output value of the current detection circuit from the second look-up table at the time of imaging, read illuminance corresponding to the potential from the first look-up table, input a signal on the illuminance to the memory circuit portion, and output the signal from the memory circuit portion.

One embodiment of the present invention can provide any of the followings: an imaging device that corrects an output value of a pixel circuit; an imaging device that stores a program for controlling an operation of reading the electric characteristics of a transistor included in a pixel circuit; a novel imaging device or the like; an operation method of an imaging device that corrects an output value of a pixel circuit; an operation method of an imaging device that reads the electric characteristics of a transistor included in a pixel circuit; and an operation method of a novel imaging device or the like.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 16A and 16B are a top view and a cross-sectional view illustrating a layout of a pixel circuit.

DETAILED DESCRIPTION OF THE INVENTION

Figure 1:
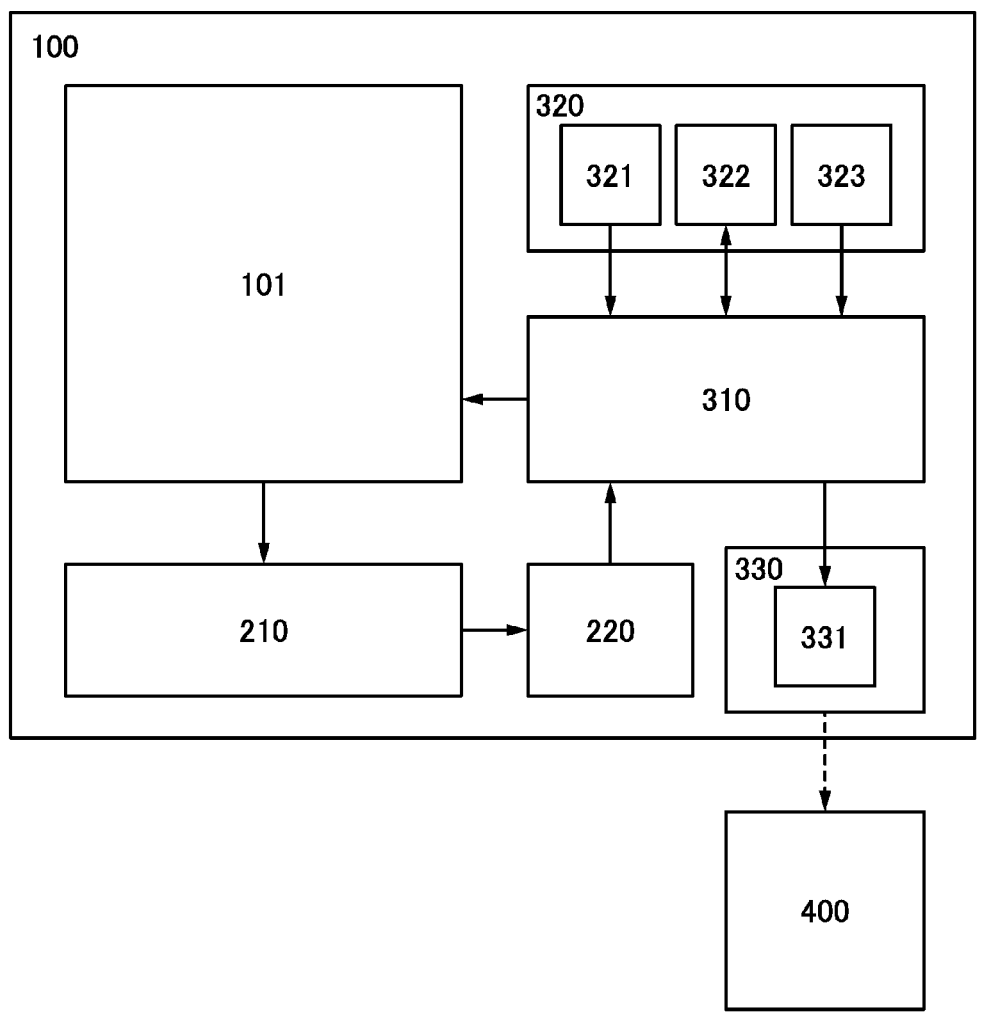
FIG. 1 is a block diagram illustrating an imaging device.

Embodiments of the present invention will be described below in detail with reference to the drawings. However, the present invention is not limited to the description below, and it is easily understood by those skilled in the art that modes and details disclosed herein can be modified in various ways. Further, the present invention is not construed as being limited to description of the embodiments. Note that in all drawings used to illustrate the embodiments, portions that are identical or portion having similar functions are denoted by the same reference numerals, and their repetitive description may be omitted.

Note that in this specification and the like, an explicit description "X and Y are connected" means that X and Y are electrically connected, X and Y are functionally connected, and X and Y are directly connected. Here, X and Y each denote an object (e.g., a device, an element, a circuit, a wiring, an electrode, a terminal, a conductive film, a layer, or the like). Accordingly, without limiting to a predetermined connection relation, for example, a connection relation shown in drawings and texts, another element may be interposed between elements having the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be turned on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit, and a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. When a signal output from X is transmitted to Y, it can be said that X and Y are functionally connected even if another circuit is provided between X and Y.

Note that an explicit description "X and Y are connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit description "X and Y are electrically connected" is the same as the description "X and Y are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. As examples of the glass substrate, a barium borosilicate glass substrate, an aluminoborosilicate glass substrate, a soda lime glass substrate, and the like can be given. For the flexible substrate, a flexible synthetic resin such as plastic typified by polyethylene terephthalate (PET), polyethylene naphthalate (PEN), and polyether sulfone (PES), or acrylic can be used, for example. For the attachment film, polypropylene, polyester, polyvinyl fluoride, polyvinyl chloride, or the like can be used, for example. For the base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Note that a transistor may be formed using one substrate, and then transferred to another substrate. Examples of a substrate to which a transistor is transferred include, in addition to the above-described substrates over which transistors can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. With the use of such a substrate, a transistor with excellent properties, a transistor with low power consumption, or a device with high durability can be formed, high heat resistance can be provided, or a reduction in weight or thickness can be achieved.

(Embodiment 1)

In this embodiment, an imaging device using radial rays such as X-rays, which is one embodiment of the present invention, is described with reference to the drawings.

FIG. 1 is an example of a block diagram of an imaging device 100 of one embodiment of the present invention, which uses radiation such as X-rays. The imaging device 100 includes a flat panel detector 101, a current detection circuit 210, an A/D converter 220, an arithmetic circuit portion 310, a first memory circuit portion 320, and a second memory circuit portion 330. The first memory circuit portion 320 stores a first look-up table 321, a second look-up table 322, and a program 323 for acquiring data of the second look-up table. The second memory circuit portion 330 includes a region 331 where image data output from the arithmetic circuit portion 310 is stored. Although FIG. 1 shows a structure in which a display device 400 is not included in the imaging device 100, the display device may be included in the imaging device 100.

The first look-up table 321 stores data of potentials, which are supplied from a light-receiving element and accumulated in a charge accumulation portion, corresponding to different levels of illuminance, in a pixel circuit included in the flat panel detector 101. The second look-up table 322 stores output data of a transistor whose gate electrode layer is connected to the charge accumulation portion, which have passed through the current detection circuit and the A/D converter and which correspond to the different potentials supplied to the charge accumulation portion.

In FIG. 1, the pixel circuit included in the flat panel detector 101 is connected to the current detection circuit 210 and the current detection circuit is connected to the A/D converter 220. Furthermore, the arithmetic circuit portion 310 is connected to the A/D converter 220, the first memory circuit portion 320, the second memory circuit portion 330, and the flat panel detector 101. In addition, the second memory circuit portion 330 is connected to the display device 400.

Figure 20A:
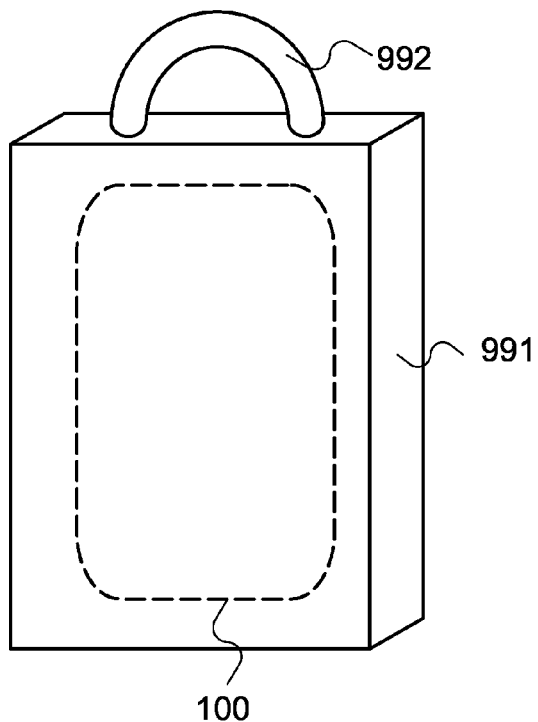
FIGS. 20A and 20B illustrate a structure of an imaging system.

FIG. 20A shows an example of a detector unit including the flat panel detector 101. A detector unit 991 is provided with a handle 992. Note that in some cases, the detector unit 991 includes not only the flat panel detector 101 but also part of or the whole of the imaging device 100.

Figure 20B:
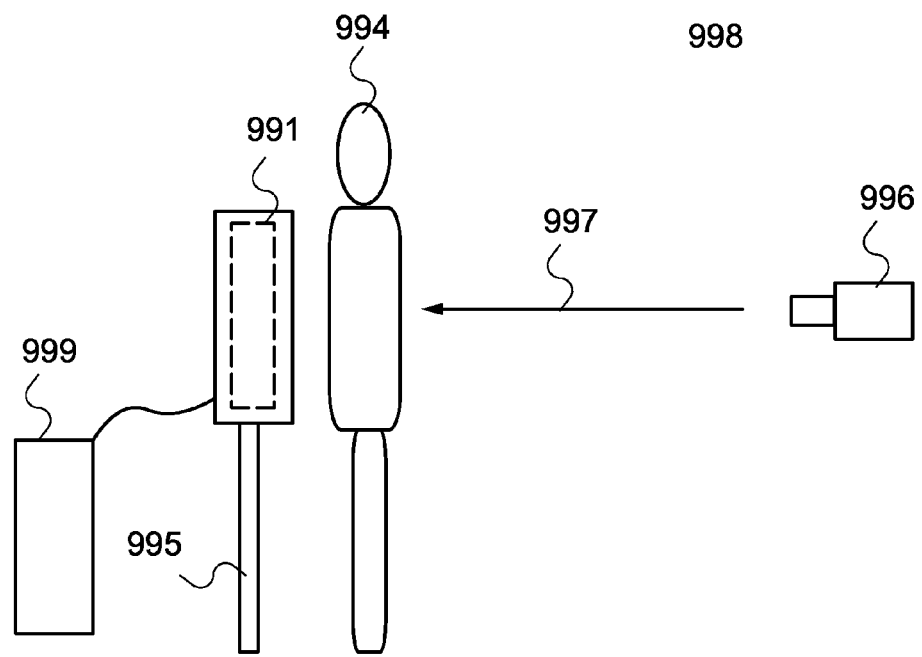

FIG. 20B shows an example of the entire structure of an imaging system 998. The detector unit 991 is placed on a stand 995. In some cases, a display device or a computer 999 is connected to the detector unit 991. An X-ray 997 emitted from an X-ray source 996 passes through a subject 994 and is detected by the detector unit 991.

Figure 2:
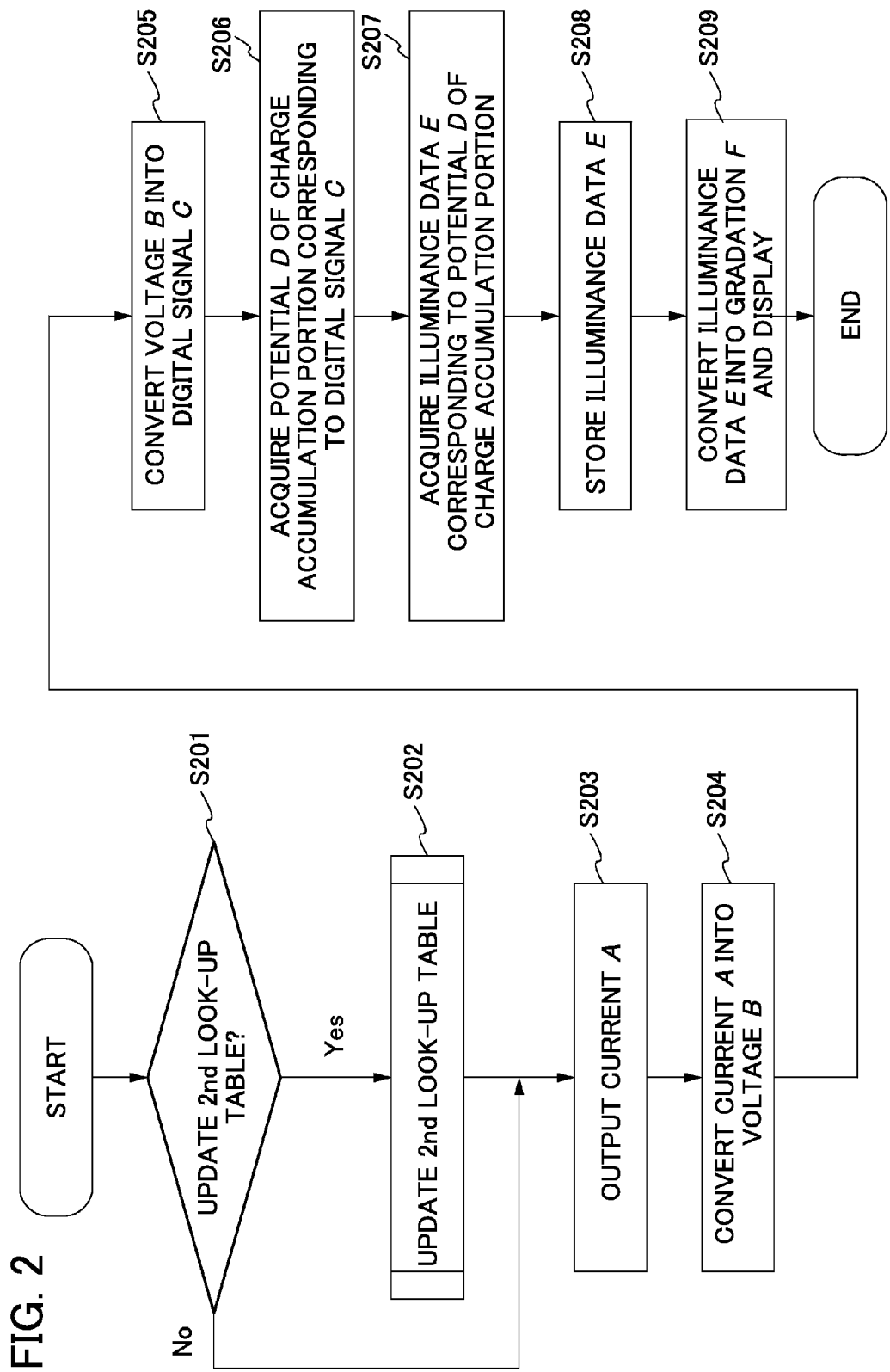
FIG. 2 is a flow chart showing an operation method of an imaging device.

A procedure of imaging by the imaging device 100 is described with reference to a flow chart shown in FIG. 2. First, it is determined whether or not the second look-up table is updated (S201). If yes, the second look-up table is updated (S202) under a procedure described later. Next, the pixel circuit included in the flat panel detector 101 outputs current A depending on illuminance (S203). Then, current A is converted into voltage B in the current detection circuit 210 (S204). Subsequently, voltage B is converted into digital signal C in the A/D converter 220 (S205). After that, potential D of the charge accumulation portion, which corresponds to digital signal C, is acquired in the arithmetic circuit portion 310 from the second look-up table 322 (S206). Then, illuminance data E corresponding to potential D of the charge accumulation portion is acquired in the arithmetic circuit portion 310 from the first look-up table 321 (S207). Next, illuminance data E is stored in the region 331 of the second memory circuit portion 330 (S208). After that, an image obtained by converting illuminance data E into gradation F is displayed on the display device (S209).

In a conventional imaging device, a look-up table storing illuminance data (e.g., illuminance data E) corresponding to an output value of a pixel circuit (e.g., digital signal C) is used; thus, when the electric characteristics of a transistor responsible for outputting of the pixel circuit change, illuminance data that is read from the look-up table becomes inaccurate, which causes a problem in acquiring accurate images.

An object of one embodiment of the present invention is to use the first look-up table 321 storing a potential of the charge accumulation portion, which corresponds to illuminance, in the pixel circuit, and the second look-up table 322 storing output data of the transistor, which corresponds to a potential (gate voltage) of the charge accumulation portion, and to update the second look-up table 322 before imaging. Updating the second look-up table 322 makes it possible to acquire accurate illuminance data even when the electric characteristics of the transistor outputting current A change with time, so that the reliability of image data acquired from the imaging device can be increased. The electric characteristics of a transistor included in a pixel circuit are easily changed (for example, the threshold voltage easily shifts) particularly in a flat panel detector that uses radiation such as X-rays. Thus, it is preferable to use one embodiment of the present invention.

Note that the updating interval of the second look-up table 322 can be determined in accordance with the predetermined period or the number of times of imaging with the use of a timer or a counter, for example. Alternatively, the second look-up table 322 may be updated every time before imaging.

Then, the details of the components included in the imaging device 100 will be described.

The flat panel detector 101 for detecting X-rays in one embodiment of the present invention can be combined with a scintillator. The scintillator is formed of a substance that, when irradiated with radial rays such as X-rays or gamma-rays, absorbs energy of the radial rays to emit visible light or ultraviolet light or a material containing the substance. For example, materials such as $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO and a resin or ceramics in which any of the materials is dispersed are known.

Radial rays such as X-rays which have penetrated a subject enter the scintillator and are converted to light (fluorescence) such as visible light or ultraviolet light. Then, the light is sensed by the light-receiving element provided in the pixel circuit, whereby image data is obtained.

Figure 3A:
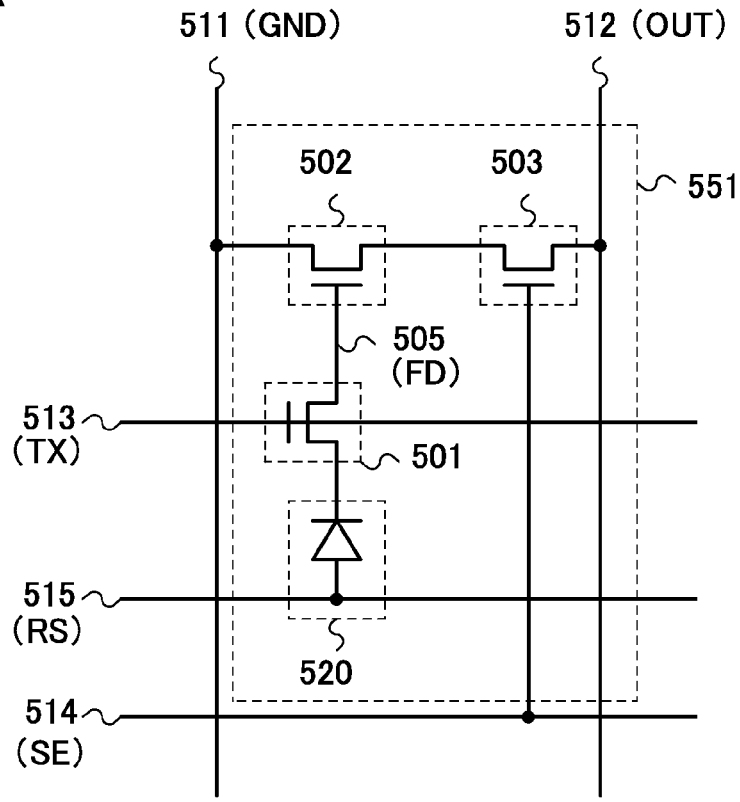
FIGS. 3A and 3B each illustrate a configuration of a pixel circuit.
Figure 3B:
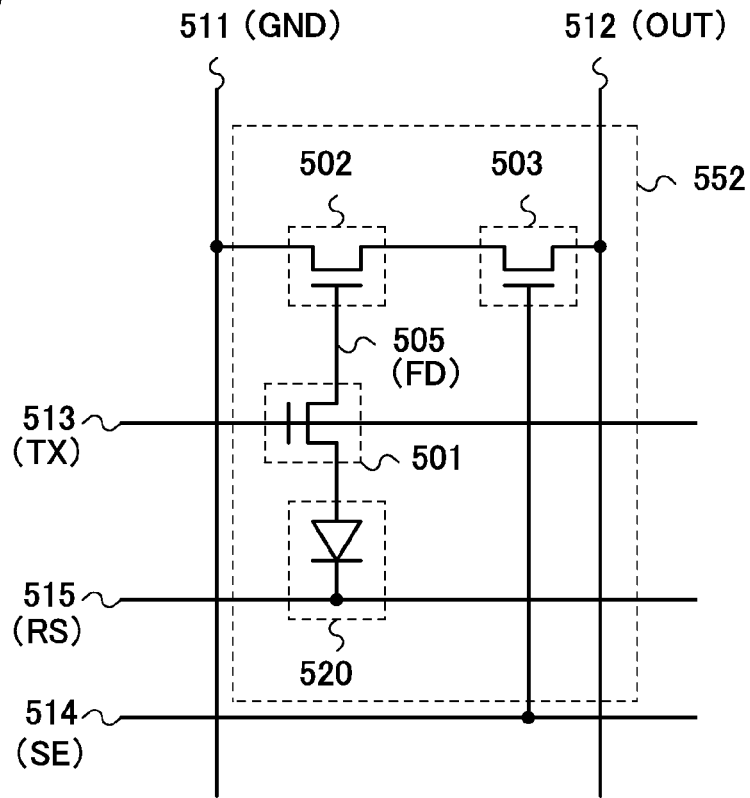

FIGS. 3A and 3B are circuit diagrams each illustrating an example of the pixel circuit included in the flat panel detector 101.

A circuit 551 illustrated in FIG. 3A includes a photodiode 520, a first transistor 501, a second transistor 502, and a third transistor 503.

One of a source and a drain of the first transistor 501 is electrically connected to a cathode of the photodiode 520. The other of the source and the drain of the first transistor 501 and a gate of the second transistor 502 is electrically connected to a wiring (FD) 505. One of a source and a drain of the second transistor 502 is electrically connected to one of a source and a drain of the third transistor 503. The other of the source and the drain of the second transistor 502 is electrically connected to a first wiring (GND) 511. The other of the source and the drain of the third transistor 503 is electrically connected to the second wiring (OUT) 512. A gate of the first transistor 501 is electrically connected to a third wiring (TX) 513. A gate of the third transistor 503 is electrically connected to a fourth wiring (SE) 514. An anode of the photodiode 520 is electrically connected to a fifth wiring (RS) 515.

The photodiode 520 is a light-receiving element and generates current corresponding to the amount of light incident on the pixel circuit. The first transistor 501 controls accumulation in the wiring (FD) 505 of electrical charges generated by the photodiode 520. The second transistor 502 outputs a signal corresponding to a potential of the wiring (FD) 505. The third transistor 503 is used to control selection of the pixel circuit at the time of reading.

Note that the wiring (FD) 505 is a charge accumulation portion retaining electrical charges whose amount changes depending on the amount of light received by the photodiode 520. Practically, the charge accumulation portion is depletion layer capacitance in the vicinity of a source region or a drain region of the first transistor 501 electrically connected to the wiring (FD) 505, wiring capacitance of the wiring (FD) 505, gate capacitance of the second transistor 502 electrically connected to the wiring (FD) 505, and the like. A capacitor may be provided between the wiring (FD) 505 and the first wiring (GND) 511.

The first wiring (GND) 511 is a signal line for setting a reference potential (e.g., GND). The second wiring (OUT) 512 is a signal line for outputting data obtained in the circuit 551. The third wiring (TX) 513 is a signal line for controlling the first transistor 501. The fourth wiring (SE) 514 is a signal line for controlling the third transistor 503. The fifth wiring (RS) 515 is a signal line for resetting the wiring (FD) 505. The fifth wiring (RS) 515 in the circuit 551 is also a signal line for performing charge accumulation in the wiring (FD) 505.

The pixel circuit may have a configuration illustrated in FIG. 3B. A circuit 552 illustrated in FIG. 3B includes the same components as those in the circuit 551 in FIG. 3A but is different from the circuit 551 in that the anode of the photodiode 520 is electrically connected to one of the source and the drain of the first transistor 501 and the cathode of the photodiode 520 is electrically connected to the fifth wiring (RS) 515.

Figure 4:
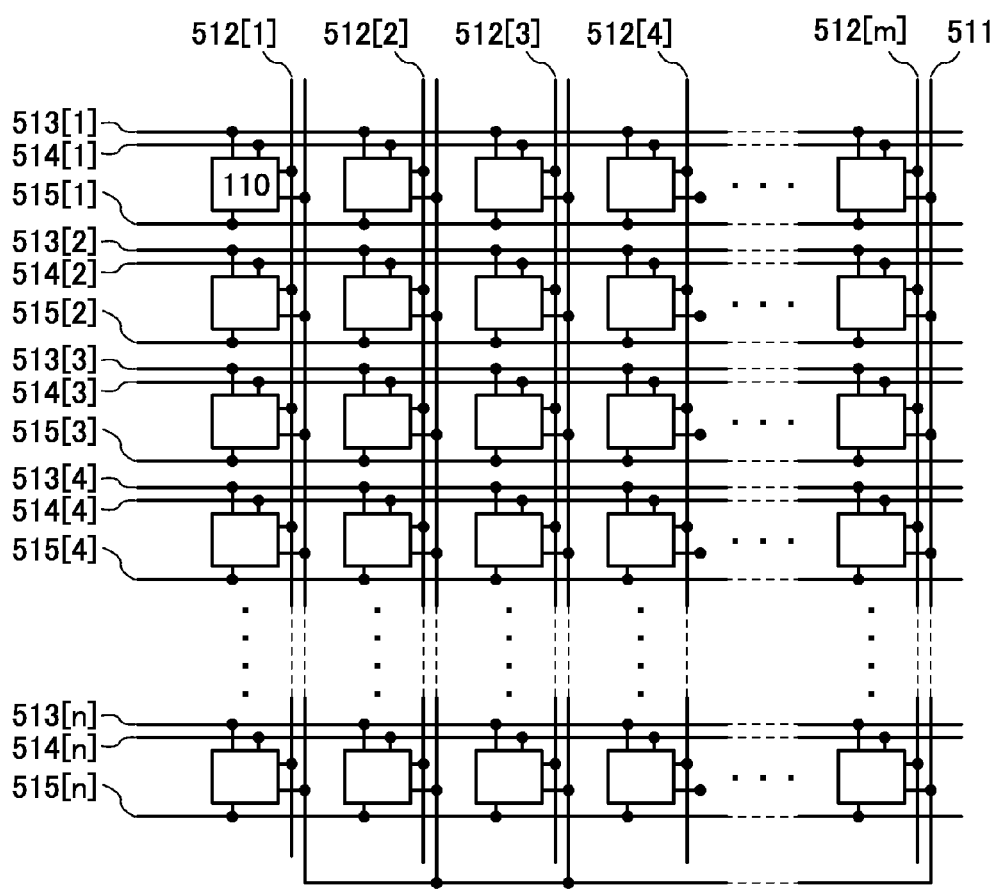
FIG. 4 illustrates a mode of connection between pixel circuits and wirings.

In the case where either of the circuits illustrated in FIGS. 3A and 3B is used as a pixel circuit 110 and the pixel circuits 110 are arranged in a matrix of m rows and n columns (each of m and n is an integer greater than or equal to 1), an example of a mode of connection with each of the wirings is as shown in FIG. 4.

Next, a structure of each component illustrated in FIGS. 3A and 3B will be described.

An element formed using a silicon semiconductor with a pn junction or a pin junction can be as the photodiode 520, for example. In the case where a scintillator emits visible light, a pin photodiode including an i-type semiconductor layer formed of amorphous silicon is preferably used. Since amorphous silicon has high sensitivity in a visible light wavelength region, weak visible light can be sensed easily.

Note that an i-type semiconductor refers not only to what is called an intrinsic semiconductor in which the Fermi level lies in the middle of the band gap, but also to a semiconductor in which the concentration of an impurity imparting p-type conductivity and the concentration of an impurity imparting n-type conductivity are less than or equal to $1\times10^{20}$ atoms/cm$^3$ and in which the photoconductivity is higher than the dark conductivity.

Although a silicon semiconductor such as amorphous silicon, microcrystalline silicon, polycrystalline silicon, or single crystal silicon can be used to form the first transistor 501, the second transistor 502, and the third transistor 503, an oxide semiconductor is preferably used to form the transistors. A transistor in which a channel formation region is formed of an oxide semiconductor has an extremely low off-state current.

In particular, when the first transistor 501 connected to the wiring (FD) 505 has a large leakage current, electrical charges accumulated in the wiring (FD) 505 cannot be retained for a sufficiently long time. When the first transistor 501 is formed using an oxide semiconductor, unwanted output of electrical charges through the photodiode can be prevented.

Unwanted output of electrical charges also occurs in the first wiring (GND) 511 or the second wiring (OUT) 512 when the second transistor 502 and the third transistor 503 have a large leakage current; thus, transistors in which a channel formation region is formed of an oxide semiconductor are preferably used as these transistors.

When the transistor using an oxide semiconductor with an extremely small off-state current is used as the second transistor 502, imaging can be performed with wider dynamic range. In the pixel circuit illustrated in FIG. 3A, a gate potential of the second transistor 502 is decreased when the intensity of light incident on the photodiode 520 is increased. In the pixel circuit illustrated in FIG. 3B, the gate potential of the second transistor 502 is decreased when the intensity of light incident on the photodiode 520 is decreased. Since the transistor using an oxide semiconductor has an extremely small off-state current, a current corresponding to the gate potential can be accurately output even when the gate potential is extremely low. Thus, it is possible to broaden the detection range of illuminance, i.e., the dynamic range.

Further, in the pixel circuit illustrated in FIG. 3B, sufficiently wide dynamic range can be obtained even when the gate potential of the second transistor 502 is relatively low, i.e., when the intensity of light emitted from the scintillator to the photodiode is low. In other words, the scintillator does not need to emit high-intensity light, which makes it possible to reduce the intensity of X-rays emitted to a subject and to reduce adverse effects of radiation on living subjects. In addition, the power consumption of the imaging device can be reduced.

Next, an example of the operation of the circuit 551 in FIG. 3A is described with reference to a timing chart in FIG. 5A.

Figure 5A:
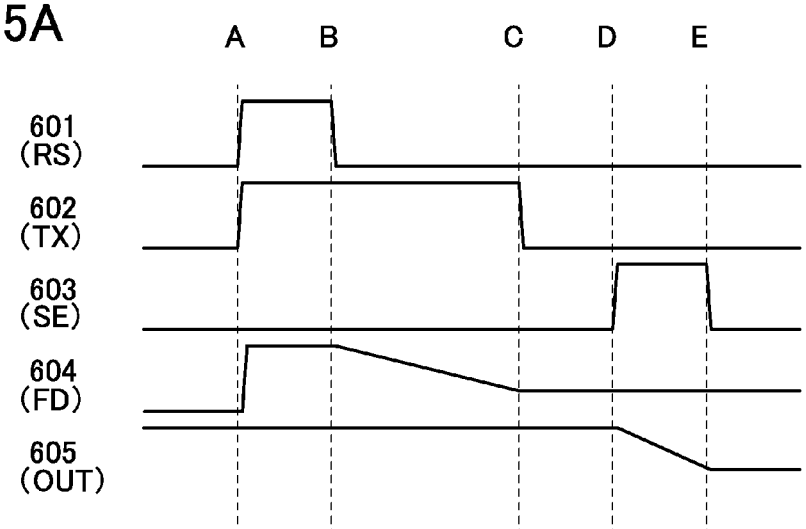
FIGS. 5A to 5C are timing charts each showing the operation of a pixel circuit.

In FIG. 5A, a potential of each wiring is denoted as a signal which varies between two levels, for simplicity. Note that in practice, the potential can have various levels depending on circumstances without being limited to two levels because each potential is an analog signal. In the drawing, a signal 601 corresponds to a potential of the fifth wiring (RS) 515; a signal 602, a potential of the third wiring (TX) 513; a signal 603, a potential of the fourth wiring (SE) 514; a signal 604, a potential of the wiring (FD) 505; and a signal 605, a potential of the second wiring (OUT) 512.

At time A, the potential of the fifth wiring (RS) 515 (signal 601) is set high and the potential of the third wiring (TX) 513 (signal 602) is set high, whereby a forward bias is applied to the photodiode 520 and the potential of the wiring (FD) 505 (signal 604) is set high. In other words, the potential of the charge accumulation portion is initialized to the potential of the fifth wiring (RS) 515 and brought into a reset state. The above is the start of a reset operation. Note that the potential of the second wiring (OUT) 512 (signal 605) is precharged to high level.

At time B, the potential of the fifth wiring (RS) 515 (signal 601) is set low and the potential of the third wiring (TX) 513 (signal 602) is set high, so that the reset operation is terminated and an accumulation operation starts. Here, a reverse bias is applied to the photodiode 520, whereby the potential of the wiring (FD) 505 (signal 604) starts to decrease due to a reverse current. Since irradiation of the photodiode 520 with light increases the reverse current, the rate of decrease in the potential of the wiring (FD) 505 (signal 604) changes depending on the amount of the light irradiation. In other words, channel resistance between the source and the drain of the second transistor 502 changes depending on the amount of light emitted to the photodiode 520.

Note that the light emitted to the photodiode 520 refers to the light which is converted from radial rays such as X-rays by the scintillator.

At time C, the potential of the third wiring (TX) 513 (signal 602) is set low to terminate the accumulation operation, so that the potential of the wiring (FD) 505 (signal 604) becomes constant. Here, the potential is determined by the number of electrical charges generated by the photodiode 520 during the accumulation operation. That is, the potential changes depending on the amount of light emitted to the photodiode 520. Further, since the first transistor 501 is a transistor including a channel formation region in an oxide semiconductor layer, which has an extremely low off-state current, the potential of the wiring (FD) 505 can be kept constant until a subsequent selection operation (read operation) is performed.

Note that when the potential of the third wiring (TX) 513 (signal 602) is set low, the potential of the wiring (FD) 505 changes due to parasitic capacitance between the third wiring (TX) 513 and the wiring (FD) 505 in some cases. In the case where this potential change is large, the number of electrical charges generated by the photodiode 520 during the accumulation operation cannot be obtained accurately. Examples of effective measures to decrease the potential change include reducing the capacitance between the gate and the source (or between the gate and the drain) of the first transistor 501, increasing the gate capacitance of the second transistor 502, and providing a storage capacitor connected to the wiring (FD) 505. Note that in this embodiment, the potential change can become negligible by the adoption of these measures.

At time D, the potential of the fourth wiring (SE) 514 (signal 603) is set high to turn on the third transistor 503, whereby the selection operation starts and the first wiring (GND) 511 and the second wiring (OUT) 512 are electrically connected to each other through the second transistor 502 and the third transistor 503. Also, the potential of the second wiring (OUT) 512 (signal 605) starts to decrease. Note that precharge of the second wiring (OUT) 512 is terminated before time D. Here, the rate of decrease in the potential of the second wiring (OUT) 512 (signal 605) depends on the current between the source and the drain of the second transistor 502. That is, the rate of decrease changes depending on the amount of light emitted to the photodiode 520 during the accumulation operation.

At time E, the potential of the fourth wiring (SE) 514 (signal 603) is set low to turn off the third transistor 503, so that the selection operation is terminated and the potential of the second wiring (OUT) 512 (signal 605) becomes a constant value. Here, the constant value depends on the amount of light emitted to the photodiode 520. Therefore, the amount of light emitted to the photodiode 520 during the accumulation operation can be known by obtaining the potential of the second wiring (OUT) 512.

Specifically, the stronger the light emitted to the photodiode 520 is, the lower the potential of the wiring (FD) 505 is and the lower a gate voltage of the second transistor 502 is, resulting in a gradual decrease in the potential of the second wiring (OUT) 512 (signal 605). Thus, a relatively high potential can be read from the second wiring (OUT) 512.

Conversely, the weaker the light emitted to the photodiode 520 is, the higher the potential of the wiring (FD) 505 is and the higher the gate voltage of the second transistor 502 is, resulting in a rapid decrease in the potential of the second wiring (OUT) 512 (signal 605). Thus, a relatively low potential can be read from the second wiring (OUT) 512.

Figure 5B:
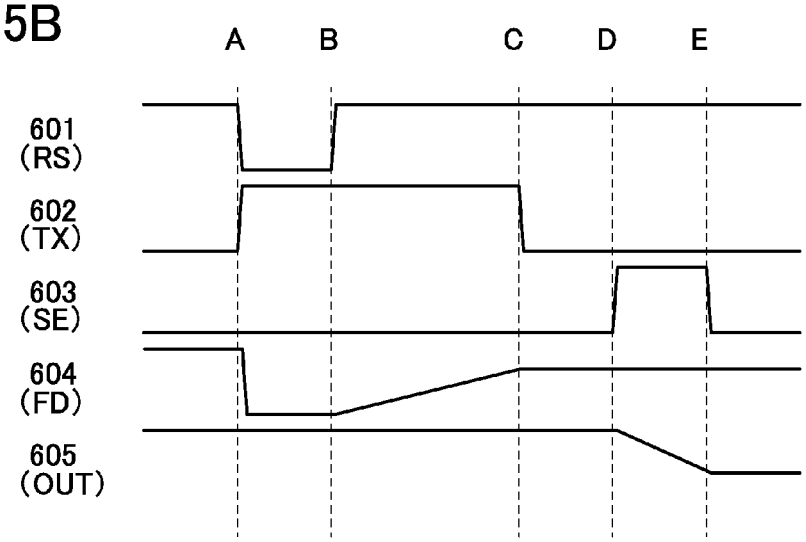

Next, an example of the operation of the circuit 552 in FIG. 3B is described with reference to a timing chart in FIG. 5B.

At time A, the potential of the fifth wiring (RS) 515 (signal 601) is set low and the potential of the third wiring (TX) 513 (signal 602) is set high, whereby a forward bias is applied to the photodiode 520 and the potential of the wiring (FD) 505 (signal 604) is set low. In other words, the potential of the charge accumulation portion is brought into a reset state. The above is the start of a reset operation. Note that the potential of the second wiring (OUT) 512 (signal 605) is precharged to high level.

At time B, the potential of the fifth wiring (RS) 515 (signal 601) is set high and the potential of the third wiring (TX) 513 (signal 602) is set high, so that the reset operation is terminated and an accumulation operation starts. Here, a reverse bias is applied to the photodiode 520, whereby the potential of the wiring (FD) 505 (signal 604) starts to increase due to a reverse current. Since irradiation of the photodiode 520 with light increases the reverse current, the rate of increase in the potential of the wiring (FD) 505 (signal 604) changes depending on the amount of the light irradiation. In other words, channel resistance between the source and the drain of the second transistor 502 changes depending on the amount of light emitted to the photodiode 520.

The description of the timing chart of FIG. 5A can be referred to for operations at and after time C. The amount of light emitted to the photodiode 520 during the accumulation operation can be known by obtaining the potential of the second wiring (OUT) 512 (signal 605) at time E.

Figure 6A:
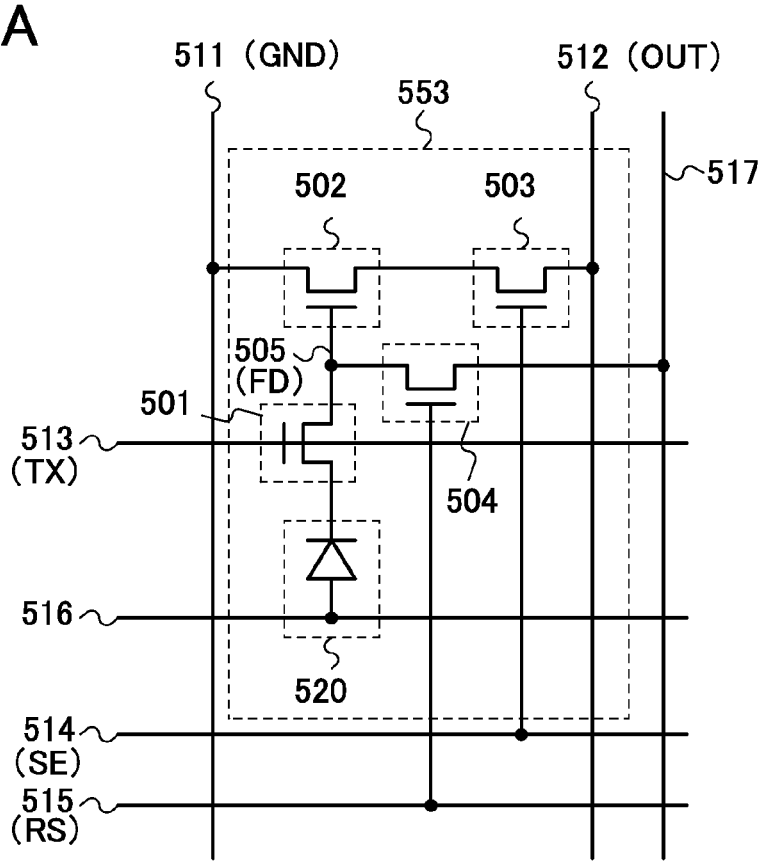
FIGS. 6A and 6B each illustrate a configuration of a pixel circuit.
Figure 6B:
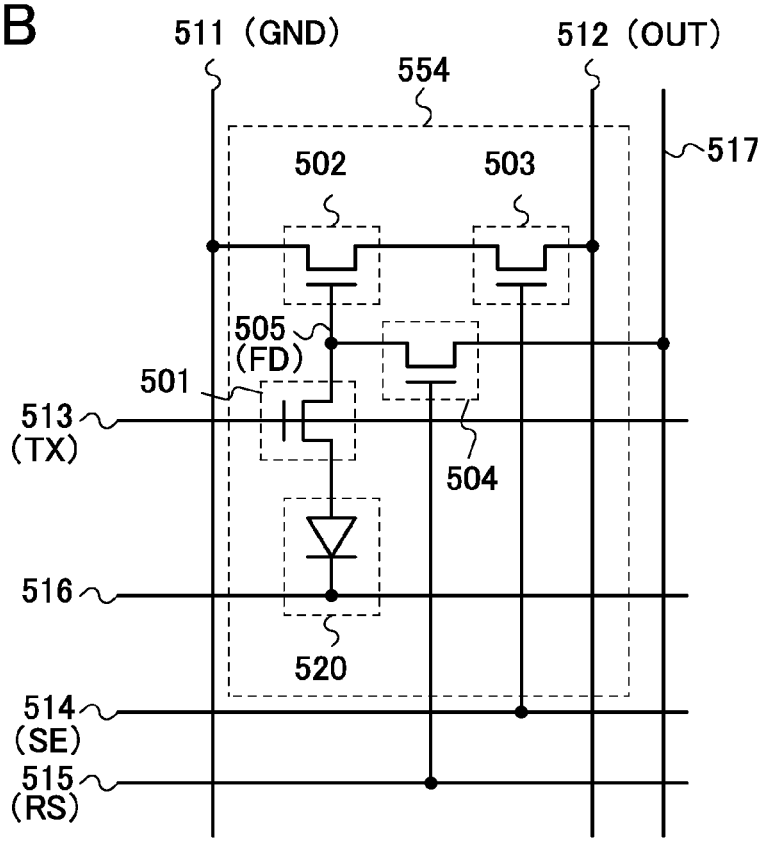

Further, the pixel circuit may have a configuration illustrated in FIG. 6A or FIG. 6B.

A circuit 553 illustrated in FIG. 6A has a configuration in which a fourth transistor 504 is added to the circuit 551. A gate of the transistor is electrically connected to the fifth wiring (RS) 515; one of a source and a drain of the transistor is electrically connected to the wiring (FD) 505; the other of the source and the drain of the transistor is electrically connected to a seventh wiring 517; and the anode of the photodiode 520 is electrically connected to a sixth wiring 516. Here, the sixth wiring 516 is a signal line (low potential line) for applying a reverse bias to the photodiode 520 all the time. The seventh wiring 517 is a signal line (high potential line) for resetting the wiring (FD) 505 to a high potential.

The fourth transistor 504 serves as a reset transistor for resetting the wiring (FD) 505. Hence, unlike in the circuit 551 in FIG. 3A, the reset operation using the photodiode 520 is not performed and a reverse bias is applied to the photodiode all the time. The wiring (FD) 505 can be reset by setting the potential of the fifth wiring (RS) 515 high. Operations of the circuit 553 are the same as those of the circuit 551 in FIG. 3A, which are illustrated in the timing chart in FIG. 5A.

A circuit 554 illustrated in FIG. 6B has a configuration in which the fourth transistor 504 is added to the circuit 552 in FIG. 3B. The gate of the transistor is electrically connected to the fifth wiring (RS) 515; one of the source and the drain of the transistor is electrically connected to the wiring (FD) 505; the other of the source and the drain of the transistor is electrically connected to the seventh wiring 517; and the cathode of the photodiode 520 is electrically connected to the sixth wiring 516. Here, the sixth wiring 516 is a signal line (high potential line) for applying a reverse bias to the photodiode 520 all the time. The seventh wiring 517 is a signal line (low potential line) for resetting the wiring (FD) 505 to a low potential.

Figure 5C:
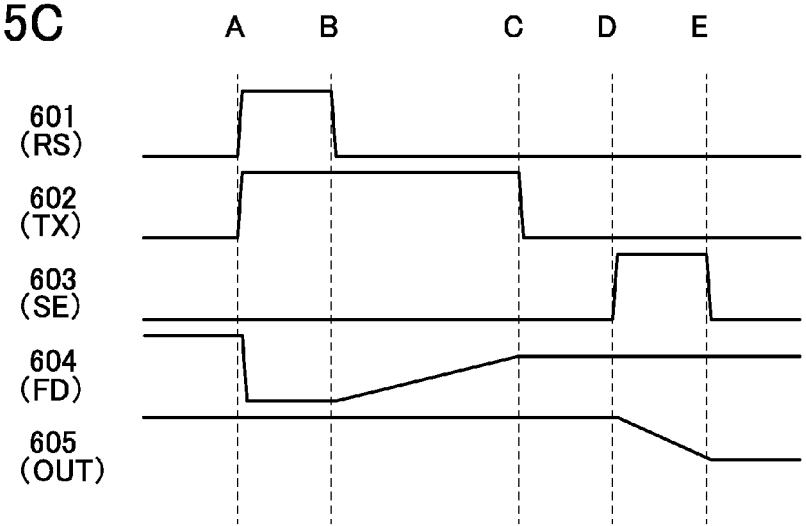

The fourth transistor 504 serves as a reset transistor for resetting the wiring (FD) 505. Hence, unlike in the circuit 552 in FIG. 3B, the reset operation using the photodiode 520 is not performed and a reverse bias is applied to the photodiode all the time. The wiring (FD) 505 can be reset by setting the potential of the fifth wiring (RS) 515 high. The circuit 554 can operate in accordance with a timing chart in FIG. 5C.

Figure 19A:
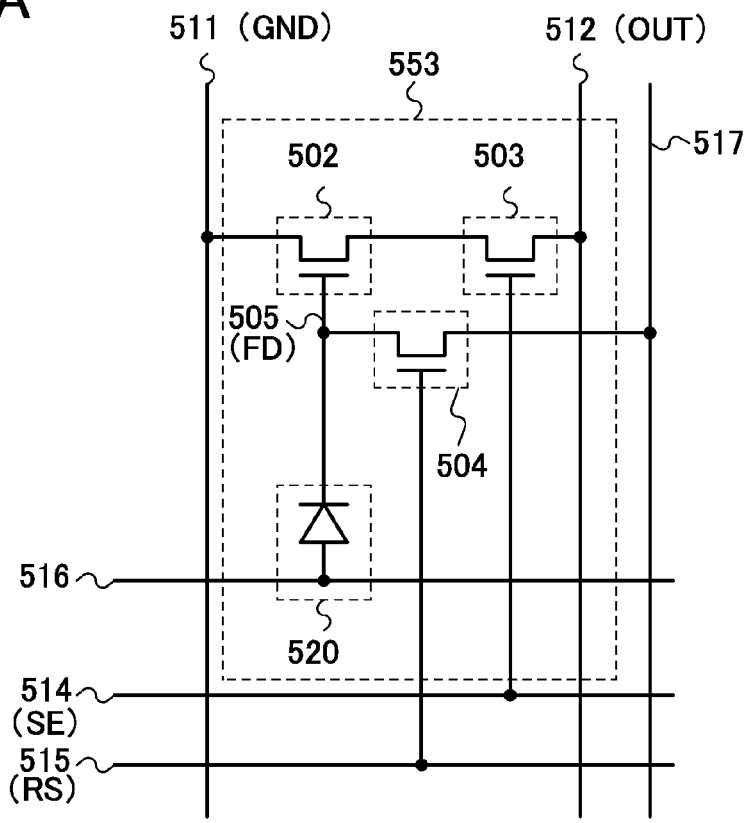
FIGS. 19A and 19B each illustrate a configuration of a pixel circuit.
Figure 19B:
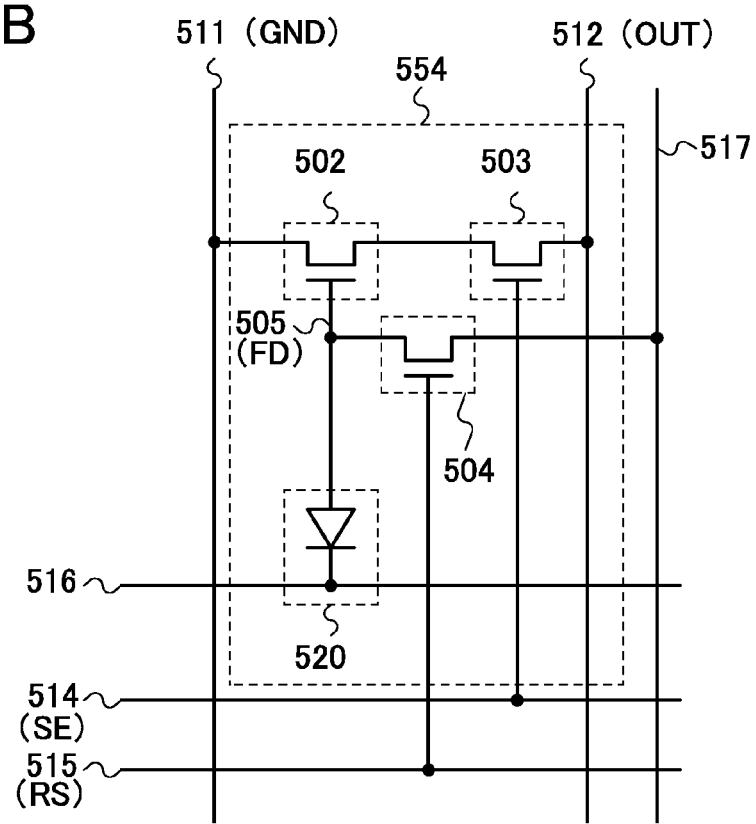

Note that although each of FIGS. 6A and 6B illustrates an example where the first transistor 501 is provided, one embodiment of the present invention is not limited thereto. A configuration in which the first transistor 501 is not included as illustrated in FIG. 19A or 19B may be employed.

The fourth transistor 504 can be formed using a silicon semiconductor such as amorphous silicon, microcrystalline silicon, polycrystalline silicon, or single crystal silicon; however, when the fourth transistor 504 has a large leakage current, electrical charges cannot be retained in the charge accumulation portion for a sufficiently long time. For this reason, a transistor formed using an oxide semiconductor with an extremely low off-state current is preferably used as the fourth transistor 504, as in the case of the first transistor 501.

Figure 7:
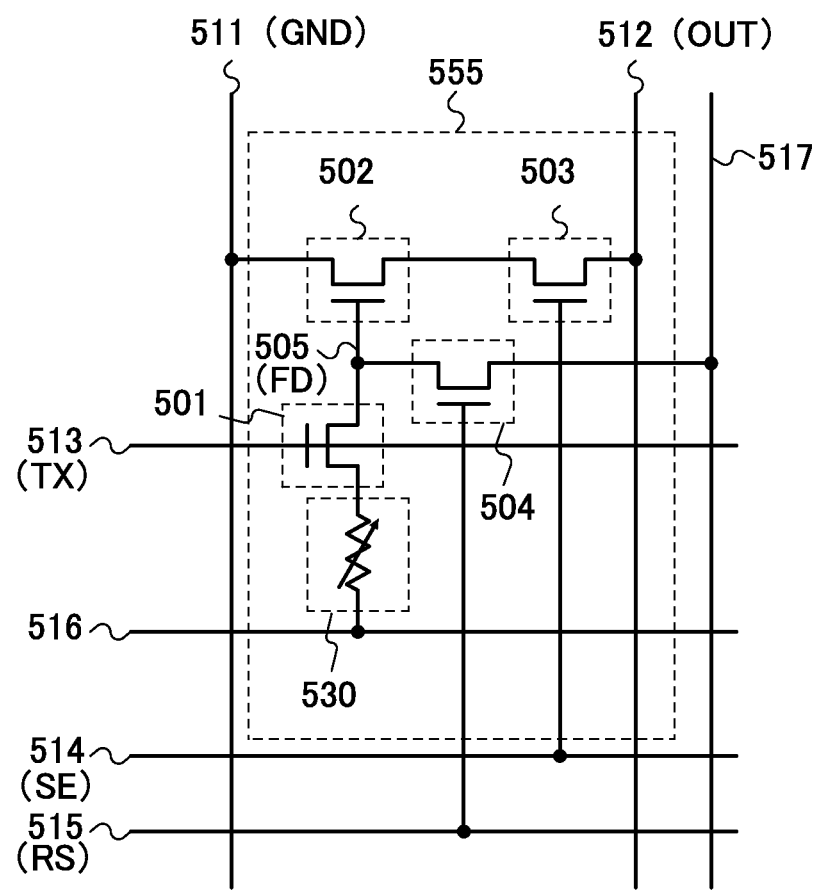
FIG. 7 illustrates a configuration of a pixel circuit.

Further, the pixel circuit may have a configuration illustrated in FIG. 7. A circuit 555 in FIG. 7 has the same configuration as that in FIG. 6A or FIG. 6B except that a variable resistive element 530 is used instead of the photodiode as a light-receiving element. For the variable resistive element, a pair of electrodes and an i-type semiconductor layer provided between the pair of electrodes can be used.

For example, the resistance changes due to visible light irradiation when an i-type amorphous silicon layer is used as the semiconductor layer; thus, the potential of the wiring (FD) 505 can be changed as in the case of using the photodiode, which enables the amount of light emitted to the variable resistive element 530 during the accumulation operation to be known. Further, as the i-type semiconductor layer, an oxide semiconductor layer having a band gap of 3 eV or more may be used. Since the resistance of the oxide semiconductor layer changes due to ultraviolet light irradiation, the potential of the wiring (FD) 505 can be changed, which enables the amount of light emitted to the variable resistive element 530 during the accumulation operation to be known. To select the wavelength of the light emitted to the variable resistive element 530, the type of the scintillator may be changed.

By setting the potential of the sixth wiring 516 low and the potential of the seventh wiring 517 high, the circuit 555 in FIG. 7 can operate in accordance with the timing chart in FIG. 5A. Further, by setting the potential of the sixth wiring 516 high and the potential of the seventh wiring 517 low, the circuit 555 can operate in accordance with the timing chart in FIG. 5C.

Figure 8A:
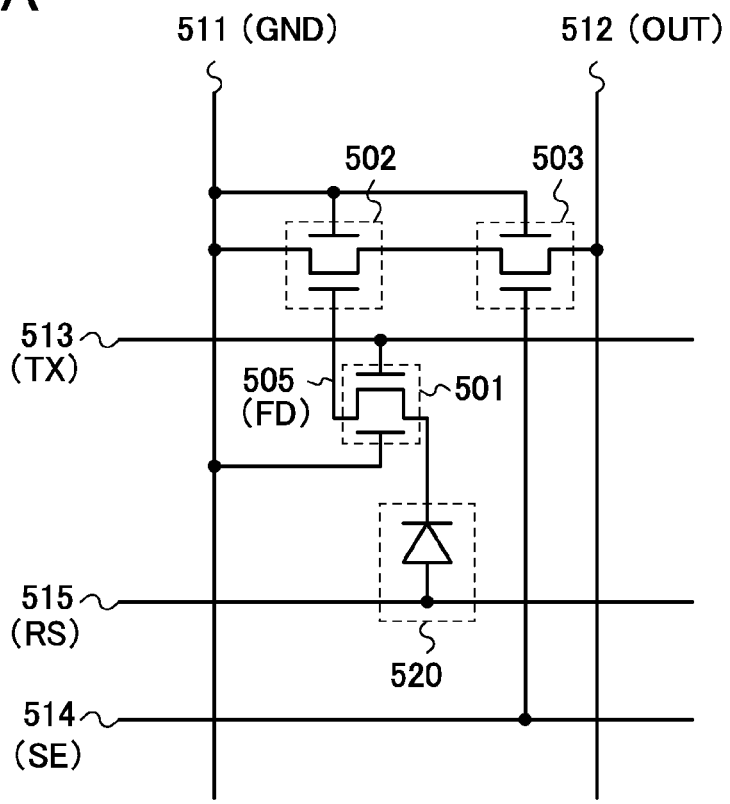
FIGS. 8A and 8B each illustrate a configuration of a pixel circuit.
Figure 8B:
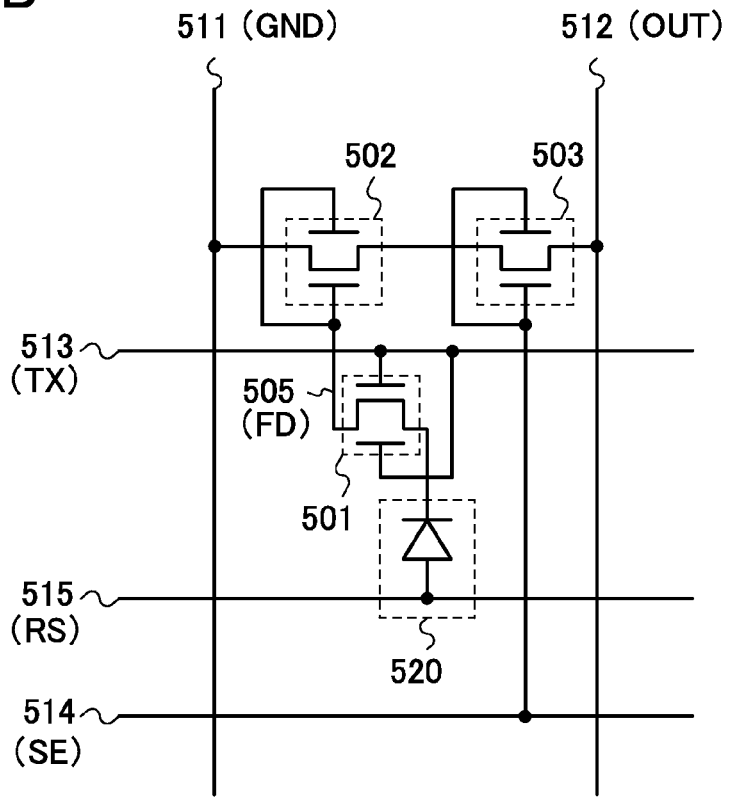

The first transistor 501, the second transistor 502, and the third transistor 503 in the pixel circuit may have back gates as illustrated in FIGS. 8A and 8B. FIG. 8A illustrates a configuration in which the back gates are applied with the same potential as their respective front gates, which enables an increase in on-state current. FIG. 8B illustrates a configuration of applying a constant potential to the back gates, which enables control of the threshold voltages. Although the back gates are electrically connected to the first wiring (GND) 511 in the configuration of FIG. 8B, they may be electrically connected to a different wiring to which a constant potential is supplied. Furthermore, although each of FIGS. 8A and 8B illustrates an example where the transistors in the circuit 551 include back gates, a configuration in which all transistors included in the circuit 552, the circuit 553, or the circuit 554 have back gates may be employed. Moreover, the configuration of applying the same potential to a front gate and a back gate, the configuration of applying a constant potential to a back gate, and the configuration without a back gate may be arbitrarily combined as necessary for the transistors in one pixel circuit.

Figure 9:
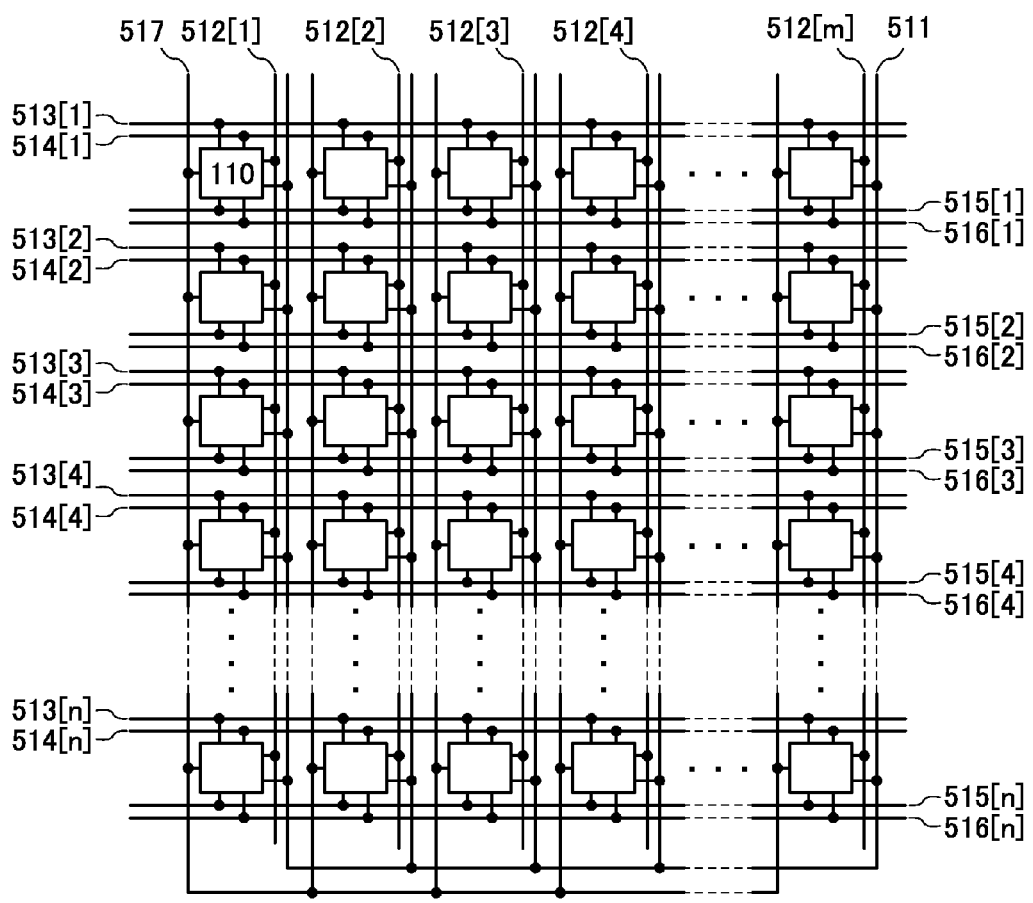
FIG. 9 illustrates a mode of connection between pixel circuits and wirings.

FIG. 9 illustrates an example of a mode of connection with each of the wirings in the case where the circuit illustrated in FIG. 6A, FIG. 6B, or FIG. 7 is used as the pixel circuit 110 and the pixel circuits 110 are arranged in a matrix of m rows and n columns (each of m and n is an integer greater than or equal to 1). The seventh wiring 517 can be shared by all pixel circuits.

Figure 10A:
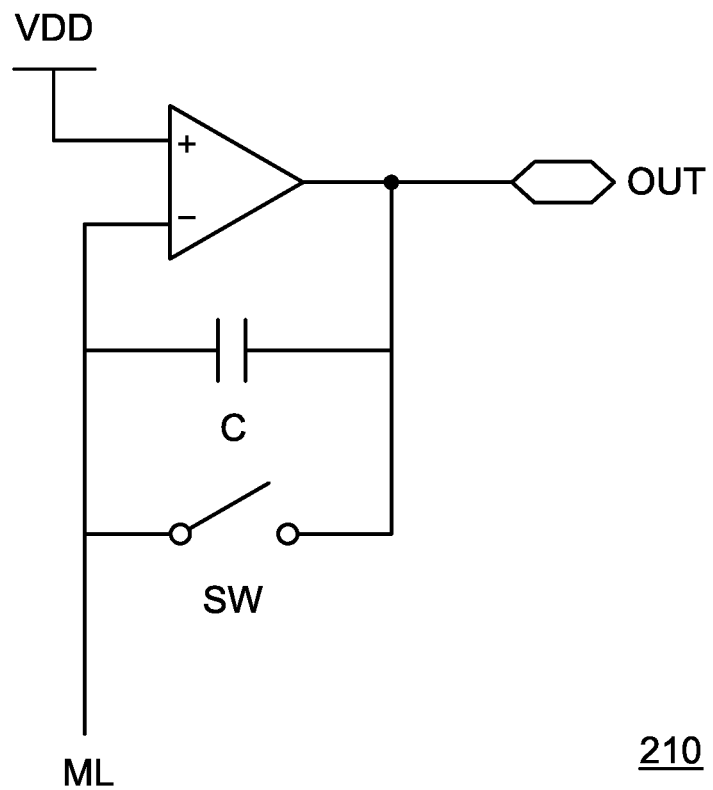
FIGS. 10A and 10B illustrate a current detection circuit and the operation thereof.
Figure 10B:
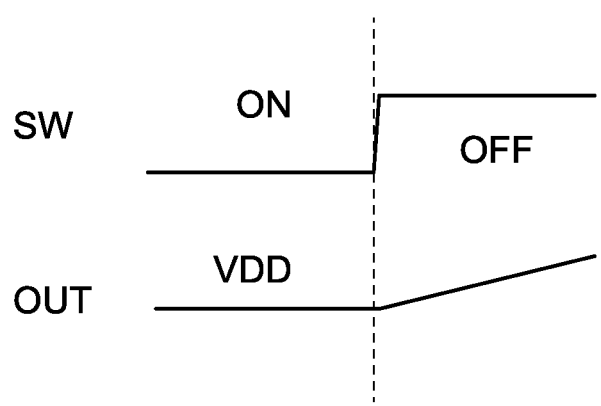

A circuit illustrated in FIG. 10A can be used as the current detection circuit 210 illustrated in FIG. 1, for example. The second wiring (OUT) 512 is connected to a wiring ML illustrated in FIG. 10A. When a switch (SW) is turned on and then is turned off as shown in FIG. 10B, a voltage signal corresponding to illuminance can be acquired from an output terminal (OUT). Moreover, the output terminal (OUT) of the current detection circuit 210 is connected to an input terminal of the A/D converter 220 (see FIG. 1), and the voltage signal is converted into a digital signal.

The structure of the arithmetic circuit portion 310 is not particularly limited and can be any structure as long as an operation of one embodiment of the present invention can be performed.

In addition, the first memory circuit portion 320 and the second memory circuit portion 330 are not particularly limited, and can be either a circuit including a volatile memory or a circuit including a nonvolatile memory. For example, a circuit including a nonvolatile memory can be used for the first memory circuit portion 320 that stores the second look-up table 322 which is rewritten at given intervals, and a circuit including a volatile memory can be used for the second memory circuit portion 330 which is required to writing and reading an image data (illuminance data) at high speed.

Figure 11:
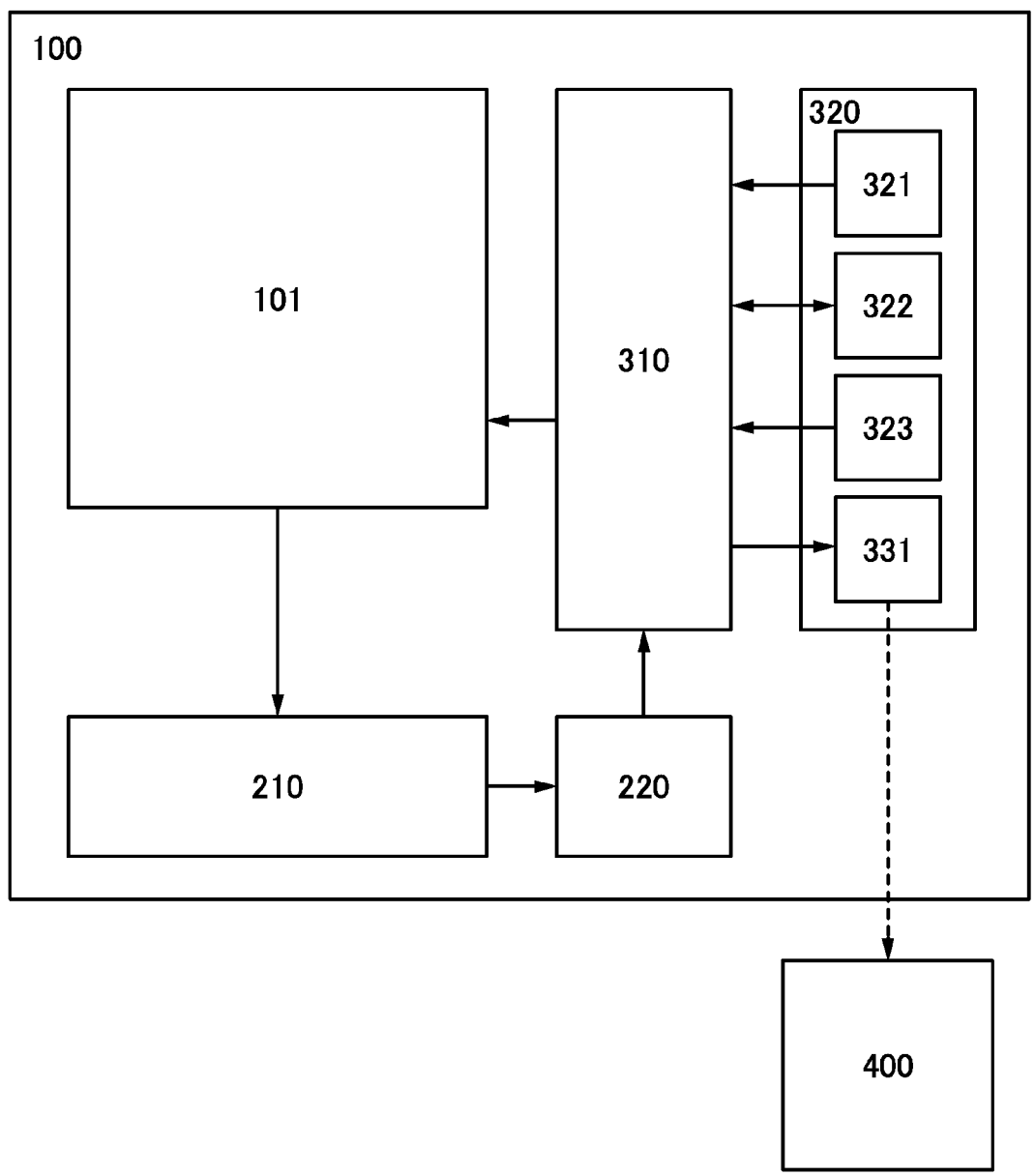
FIG. 11 is a block diagram illustrating an imaging device.

FIG. 1 illustrates a structure including two memory circuit portions: the first memory circuit portion 320 and the second memory circuit portion 330; a structure illustrated in FIG. 11 may be employed in which the imaging device 100 includes only one memory circuit portion (the first memory circuit portion 320), and the memory circuit portion includes the first look-up table 321, the second look-up table 322, the program 323 for acquiring data of the second look-up table, and the region 331 where image data output from the arithmetic circuit portion 310 is stored.

Figure 12:
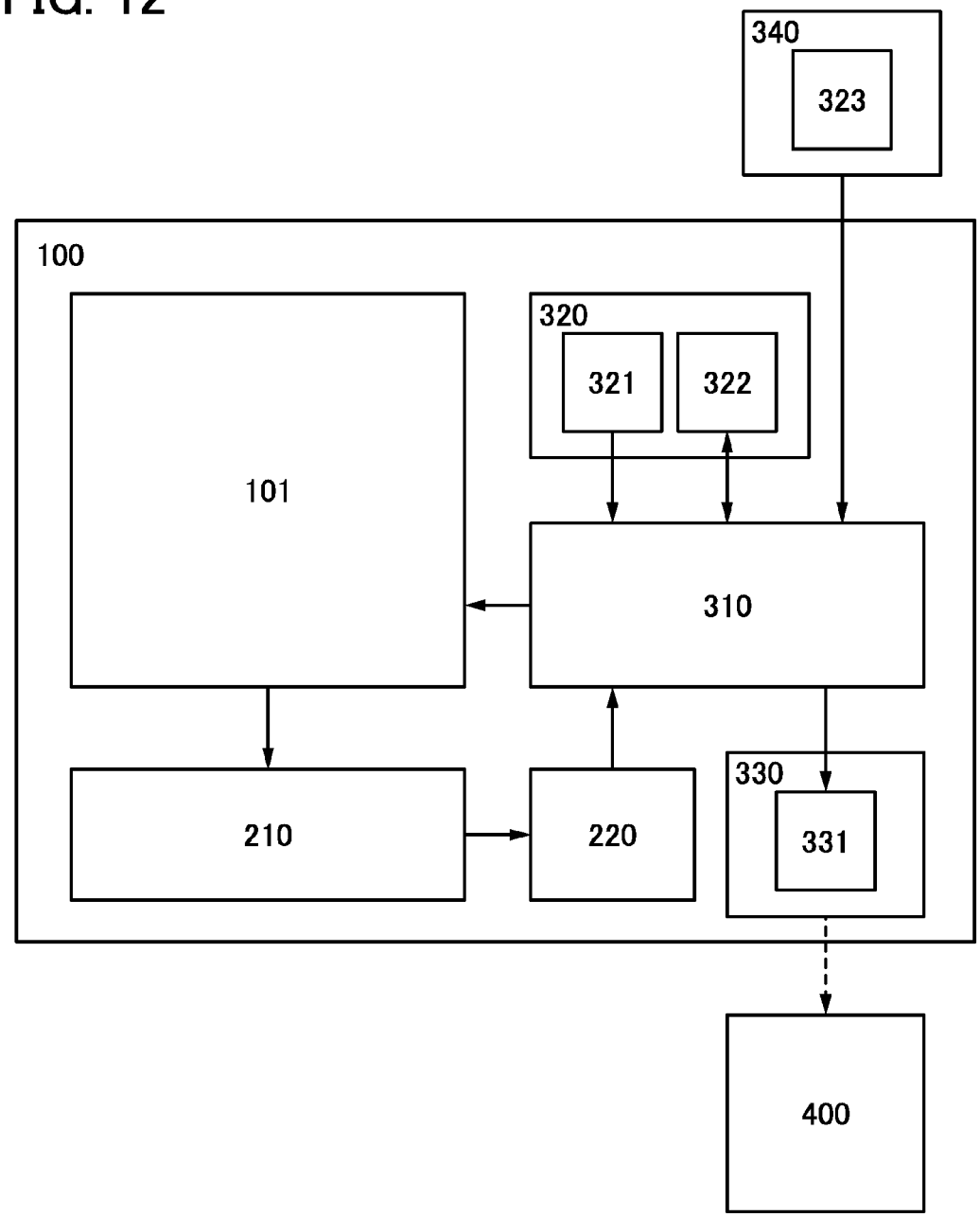
FIG. 12 is a block diagram illustrating an imaging device.

Alternatively, as illustrated in FIG. 12, the program 323 for acquiring data of the second look-up table may be stored in a storage device 340 or the like which is provided outside the imaging device 100. For example, the program may be stored in a storage medium connected to a computer for controlling the arithmetic circuit portion 310.

Further alternatively, although not illustrated, each of the first look-up table 321, the second look-up table 322, the program 323 for acquiring data of the second look-up table, and the region 331 where image data output from the arithmetic circuit portion 310 is stored may be assigned to respective memory circuit portion. In that case, a memory circuit portion including the first look-up table 321 may be a read-only memory (ROM).

Next, an example of a procedure of updating the second look-up table 322 in the case where the circuit 551 in FIG. 3A is used as the pixel circuit will be described with reference to a flow chart shown in FIG. 13. The second look-up table 322 is updated when the program 323 is executed in the arithmetic circuit portion 310.

First, the potential of the second wiring (OUT) 512 is reset (S301). In that case, the second wiring (OUT) 512 is precharged to a high potential, for example.

Then, with the use of different potentials, which are determined by the second look-up table 322 and supplied to a charge accumulation portion, as potential X, the following steps are repeated: a step (S303) of applying potential X to the fifth wiring (RS) 515; a step (S304) of converting the potential of the second wiring (OUT) 512 into a voltage signal in the current detection circuit; a step (S305) of converting the voltage signal into a digital signal in the A/D converter; and a step (S306) of writing the digital signal to the second look-up table 322.

Note that writing to the second look-up table 322 can be performed after all data is acquired. Data written in the second look-up table 322 specifically corresponds to the current-voltage characteristics of the second transistor 502.

The method for updating the second look-up table 322 can also be employed in the case where the circuit 552 in FIG. 3B is used as the pixel circuit.

Figure 13:
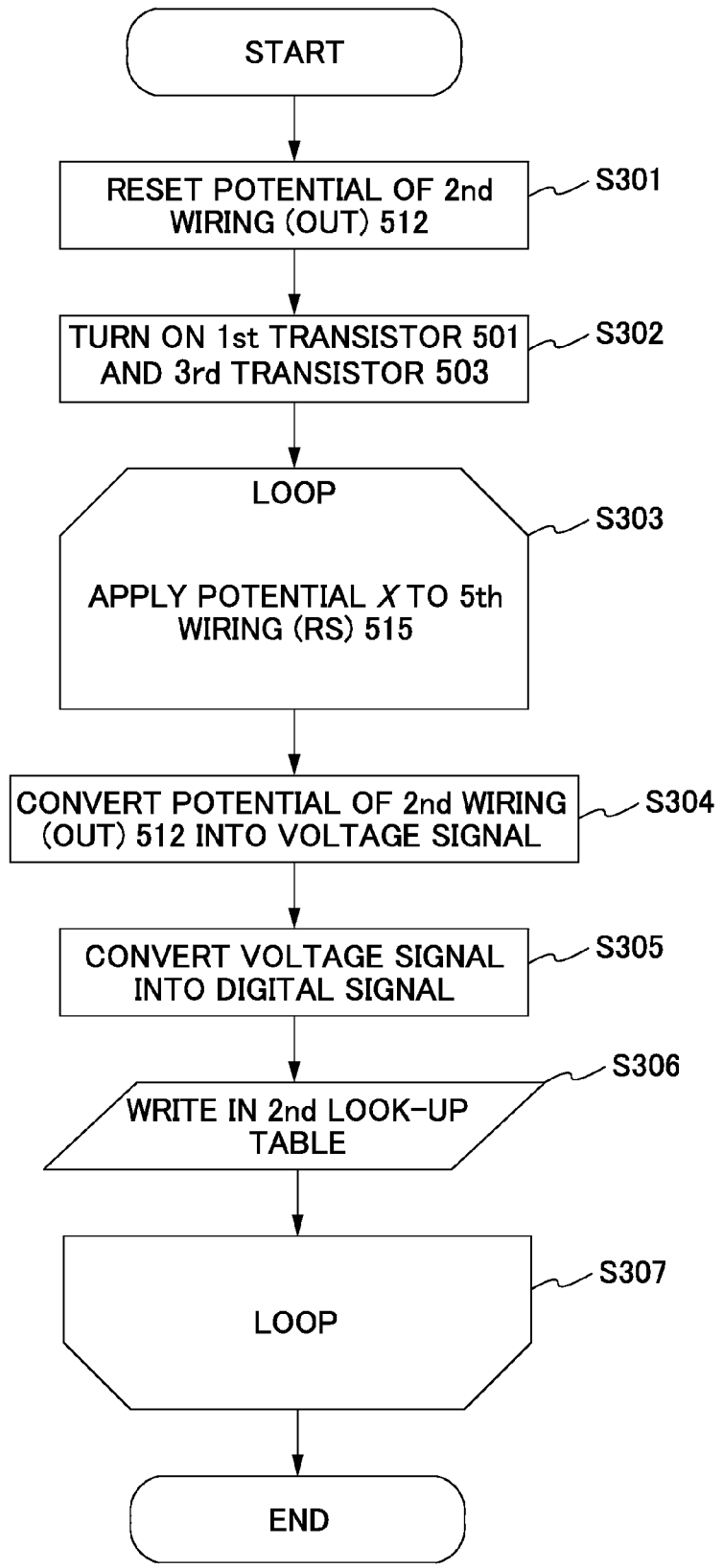
FIG. 13 is a flow chart showing an operation method of an imaging device.

In the case where the circuit 553 in FIG. 6A, the circuit 554 in FIG. 6B, or the circuit 555 in FIG. 7 is used as the pixel circuit, the third transistor 503 and the fourth transistor 504 are turned on in the second step (S302) in FIG. 13 and potential X is applied to the seventh wiring 517 in the third step (S303).

With the use of one embodiment of the present invention, an imaging device can be provided in which accurate illuminance data can be acquired owing to correction even when the electric characteristics of a transistor included in a pixel circuit change.

Note that in this specification and the like, it might be possible for those skilled in the art to constitute one embodiment of the present invention even when portions to which all the terminals of an active element (e.g., a transistor or a diode), a passive element (e.g., a capacitor or a resistor), or the like are connected are not specified. In other words, one embodiment of the present invention can be clear even when connection portions are not specified. Moreover, in the case where a connection portion is disclosed in this specification and the like, it can be determined that one embodiment of the present invention in which a connection portion is not specified is disclosed in this specification and the like, in some cases. In particular, in the case where there are several possible portions to which a terminal can be connected, it is not necessary to specify all the portions to which the terminal is connected. Thus, it might be possible to constitute one embodiment of the present invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, one embodiment of the present invention can be clear when a function of a circuit is specified. Moreover, it can be determined that one embodiment of the present invention whose function is specified is disclosed in this specification and the like. Thus, when a connection portion of a circuit is specified, the circuit is disclosed as one embodiment of the present invention even when a function of the circuit is not specified, and one embodiment of the present invention can be constituted. Alternatively, when a function of a circuit is specified, the circuit is disclosed as one embodiment of the present invention even when a connection portion is not specified, and one embodiment of the present invention can be constituted.

Note that in this specification and the like, part of a diagram or a text described in one embodiment can be taken out to constitute one embodiment of the present invention. Thus, in the case where a diagram or a text related to a certain part is described, a content taken out from a diagram or a text of the certain part is also disclosed as one embodiment of the present invention and can constitute one embodiment of the present invention. Thus, for example, part of a diagram or a text including one or more of active elements (e.g., transistors or diodes), wirings, passive elements (e.g., capacitors or resistors), conductive layers, insulating layers, semiconductor layers, organic materials, inorganic materials, components, devices, operation methods, manufacturing methods, or the like can be taken out to constitute one embodiment of the present invention. For example, M circuit elements (e.g., transistors or capacitors) (M is an integer) are picked up from a circuit diagram in which N circuit elements (e.g., transistors or capacitors) (N is an integer, where M<N) are provided, whereby one embodiment of the present invention can be constituted. As another example, M layers (M is an integer) are picked up from a cross-sectional view in which N layers (N is an integer, where M<N) are provided, whereby one embodiment of the present invention can be constituted. As another example, M elements (M is an integer) are picked up from a flow chart in which N elements (N is an integer, where M<N) are provided, whereby one embodiment of the present invention can be constituted.

This embodiment can be implemented in appropriate combination with any of the structures described in the other embodiments.

(Embodiment 2)

In this embodiment, an example of a driving method of the pixel circuit described in Embodiment 1 is described.

As described in Embodiment 1, the operation of the pixel circuit is repetition of the reset operation, the accumulation operation, and the selection operation. In the imaging device using radial rays such as X-rays, radiation exposure time is preferably as short as possible in consideration of influence of radial rays on the living body. To shorten the radiation irradiation time and perform imaging in short time, it is necessary to perform the reset operation, the accumulation operation, and the selection operation of all the pixel circuits at high speed.

Figure 14A:
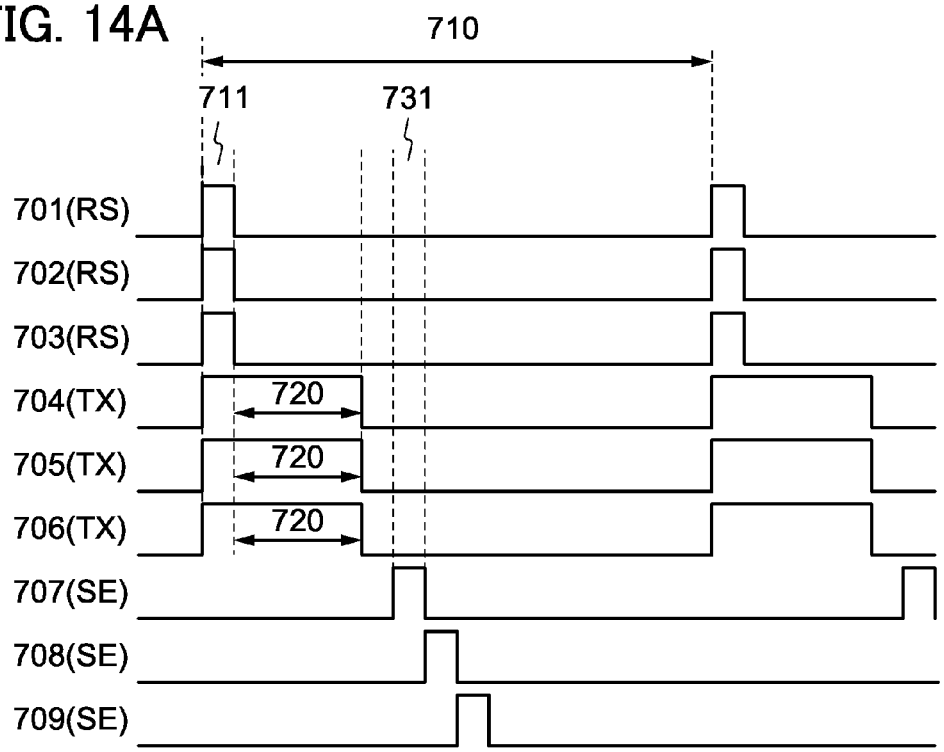
FIGS. 14A and 14B are timing charts illustrating the operations in a global shutter system and a rolling shutter system, respectively.

Thus, a driving method using a global shutter system illustrated in a timing chart in FIG. 14A is preferably used for imaging. Note that FIG. 14A shows operations of the imaging device in which a plurality of pixel circuits 551 illustrated in FIG. 3A are arranged in a matrix, specifically, operations of the circuits 551 from the first row to the third row of the first to last rows. The operation described below can be applied to the circuit 553 in FIG. 6A, the circuit 555 in FIG. 7, and the circuits in FIGS. 8A and 8B.

In FIG. 14A, a signal 701, a signal 702, and a signal 703 are signals input to the fifth wirings (RS) 515 connected to the pixel circuits in the first row, the second row, and the third row, respectively. A signal 704, a signal 705, and a signal 706 are signals input to the third wirings (TX) 513 connected to the pixel circuits in the first row, the second row, and the third row, respectively. A signal 707, a signal 708, and a signal 709 are signals input to the fourth wirings (SE) 514 connected to the pixel circuits in the first row, the second row, and the third row, respectively.

A period 710 is a period required for one imaging. In a period 711, the pixel circuits in each row perform the reset operation at the same time. In a period 720, the pixel circuits in each row perform the accumulation operation at the same time. The selection operation of the pixel circuits is sequentially performed on the row basis. For example, a period 731 is a period for performing the selection operation in the pixel circuits in the first row. In this manner, in the global shutter system, the reset operation is performed in all the pixel circuits substantially at the same time, the accumulation operation is performed in all the pixel circuits substantially at the same time, and then the read operation is sequentially performed on the row basis.

That is, in the global shutter system, since the accumulation operation is performed in all the pixel circuits substantially at the same time, imaging is simultaneously performed in the pixel circuits in all the rows. Thus, radiation irradiation in synchronization with the accumulation operation can shorten the radiation irradiation time of a subject. That is, the radiation irradiation is performed only in the period 720.

Figure 14B:
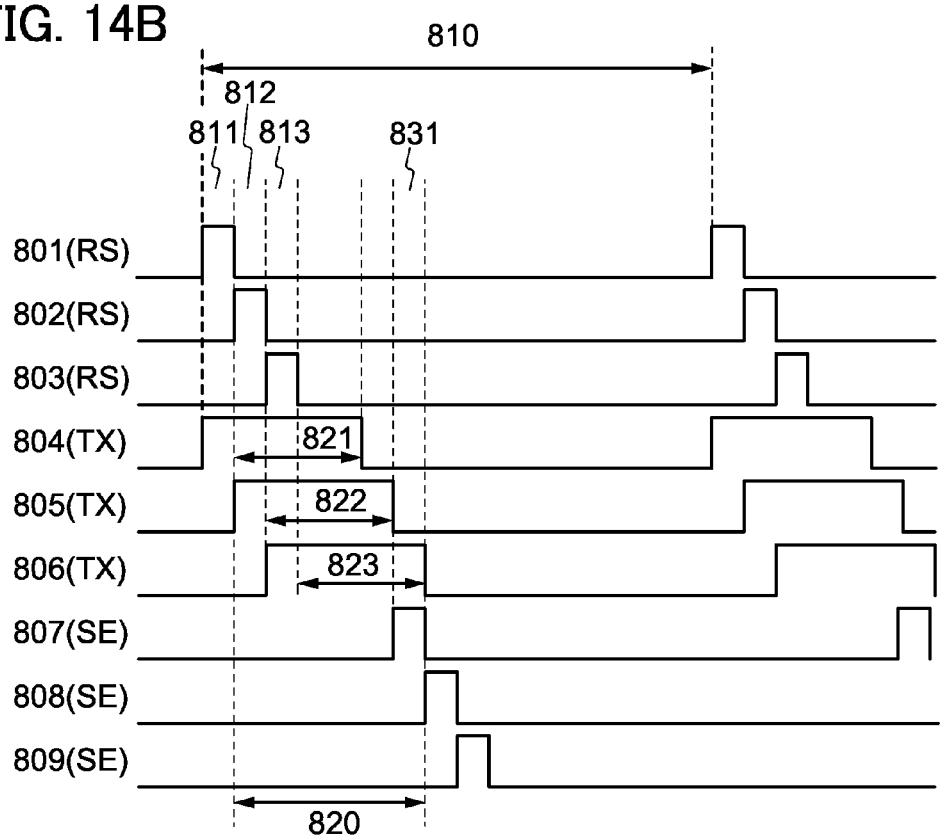

FIG. 14B is a timing chart of the case where a rolling shutter system is used. A period 810 is a period required for one imaging. A period 811, a period 812, and a period 813 are reset periods in the first row, the second row, and the third row, respectively. A period 821, a period 822, and a period 823 are accumulation operation periods in the first row, the second row, and the third row, respectively. In a period 831, the selection operation is performed in the pixel circuits in the first row. As described above, in the rolling shutter system, the accumulation operation is not performed at the same time in all the pixel circuits but is sequentially performed on the row basis; thus, imaging is not simultaneously performed in the pixel circuits in all the rows. For this reason, even when the radiation irradiation is synchronized with the accumulation operation, a radiation irradiation period 820 is longer than the period in the global shutter system. However, by performing operations at high speed, a radiation irradiation period can be shortened even in the rolling shutter system; thus, the rolling shutter system can be used as a driving method of the imaging device of one embodiment of the present invention.

To realize the global shutter system, even after the accumulation operation, the potential of the wiring (FD) 505 in each pixel circuit needs to be kept for a long time until the read operation is performed. As described above, when a transistor including a channel formation region formed of an oxide semiconductor, which has an extremely low off-state current, is used as the first transistor 501, the potential of the wiring (FD) 505 can be kept for a long time. In the case where a transistor including a channel formation region formed of a silicon semiconductor or the like is used as the first transistor 501, the potential of the wiring (FD) 505 cannot be kept for a long time because of a high off-state current, which makes it difficult to use the global shutter system.

As described above, the use of transistors including a channel formation region formed of an oxide semiconductor in the pixel circuits makes it easy to realize the global shutter system; accordingly, the imaging device that allows for low dose of radiation emitted to a subject can be provided.

This embodiment can be implemented in appropriate combination with any of the structures described in the other embodiments.

(Embodiment 3)

In this embodiment, a layout example of the pixel circuit is described with reference to FIGS. 15A and 15B and FIGS. 16A and 16B.

Figures 15A, 15B:
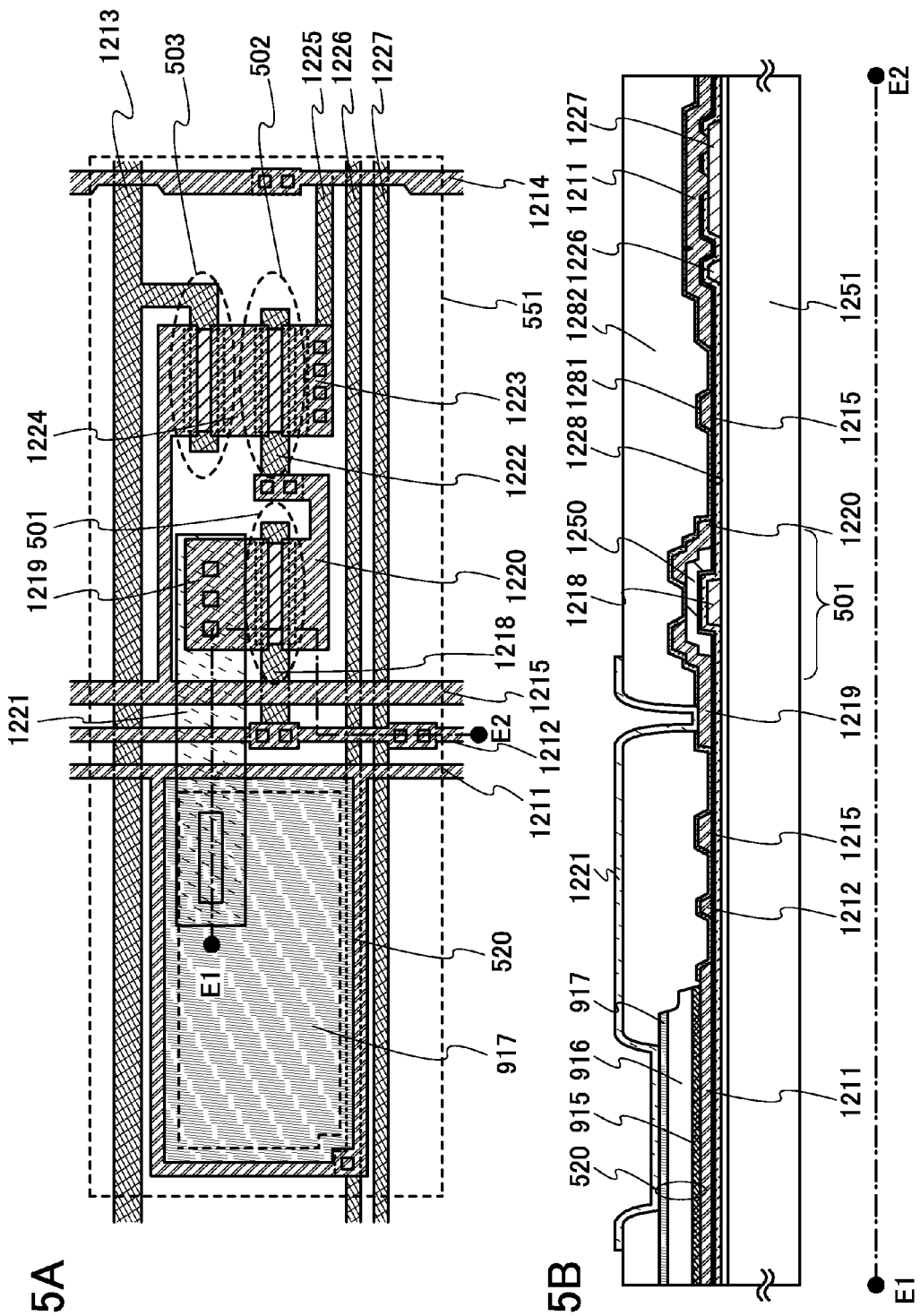
FIGS. 15A and 15B are a top view and a cross-sectional view illustrating a layout of a pixel circuit.

FIG. 15A is a top view of the circuit 551 illustrated in FIG. 3A and FIG. 15B is a cross-sectional view taken along the dashed-dotted line E1-E2 in FIG. 15A.

The circuit 551 includes a conductive film 1211 serving as the fifth wiring (RS) 515, a conductive film 1212 serving as the third wiring (TX) 513, a conductive film 1213 serving as the fourth wiring (SE) 514, a conductive film 1214 serving as the first wiring (GND) 511, and a conductive film 1215 serving as the second wiring (OUT) 512.

The photodiode 520 included in the circuit 551 includes a p-type semiconductor film 915, an i-type semiconductor film 916, and an n-type semiconductor film 917 which are stacked in this order. The conductive film 1211 is electrically connected to the p-type semiconductor film 915 serving as the anode of the photodiode 520.

A conductive film 1218 included in the circuit 551 serves as a gate electrode of the first transistor 501 and is electrically connected to the conductive film 1212. A conductive film 1219 serves as one of a source electrode and a drain electrode of the first transistor 501. A conductive film 1220 serves as the other of the source electrode and the drain electrode of the first transistor 501. A conductive film 1221 is electrically connected to the n-type semiconductor film 917 and the conductive film 1219. A conductive film 1222 serves as a gate electrode of the second transistor 502 and is electrically connected to the conductive film 1220.

A conductive film 1223 included in the circuit 551 serves as one of a source electrode and a drain electrode of the second transistor 502. A conductive film 1224 serves as the other of the source electrode and the drain electrode of the second transistor 502 and one of a source electrode and a drain electrode of the third transistor 503. The conductive film 1214 serves as the other of the source electrode and the drain electrode of the third transistor 503. The conductive film 1213 also serves as a gate electrode of the third transistor 503. A conductive film 1225 is electrically connected to the conductive film 1223 and the conductive film 1214.

In FIGS. 15A and 15B, a conductive film 1226 included in the circuit 551 is electrically connected to the conductive film 1211 serving as the fifth wiring (RS) 515. A conductive film 1227 included in the circuit 551 is electrically connected to the conductive film 1212 serving as the third wiring (TX) 513.

The conductive films 1213, 1218, 1222, 1225, 1226, and 1227 can be formed by processing one conductive film formed over an insulating surface into desired shapes. A gate insulating film 1228 is formed over the conductive films 1213, 1218, 1222, 1225, 1226, and 1227. The conductive films 1211, 1212, 1214, 1215, 1219, 1220, 1223, and 1224 can be formed by processing one conductive film formed over the gate insulating film 1228 into desired shapes.

An insulating film 1281 and an insulating film 1282 are formed over the conductive films 1211, 1212, 1214, 1215, 1219, 1220, 1223, and 1224. The conductive film 1221 is formed over the insulating film 1281 and the insulating film 1282.

An oxide semiconductor is preferably used for a semiconductor layer 1250 of the first transistor 501. In order that electrical charges generated by irradiation of the photodiode 520 with light are retained for a long time, the first transistor 501 electrically connected to the charge accumulation portion needs to be a transistor with an extremely low off-state current. Thus, the use of an oxide semiconductor material as the semiconductor layer 1250 improves the performance of the circuit 551. Note that the charge accumulation portion is the wiring 505 in the circuit 551 and corresponds to the conductive film 1220 in FIGS. 15A and 15B. The second transistor 502 and the third transistor 503 can also have a structure similar to that of the first transistor 501.

Further, the circuit 551 may have a configuration in which an element such as a transistor overlaps with the photodiode 520 as illustrated in FIGS. 16A and 16B. Such a configuration increases the density of pixels and the resolution of the imaging device. In addition, the area of the photodiode 520 can be increased, resulting in an increase in the sensitivity of the imaging device. FIG. 16A is a top view of the circuit 551 and FIG. 16B is a cross-sectional view taken along the dashed-dotted line F1-F2 in FIG. 16A.

In the circuit 551 illustrated in FIGS. 16A and 16B, the conductive film 1219 serving as one of the source electrode and the drain electrode of the first transistor 501 is electrically connected to the n-type semiconductor film 917 serving as the cathode of the photodiode 520 through a conductive film 1229. The p-type semiconductor film 915 serving as the anode of the photodiode 520 is electrically connected to the conductive film 1226 in contact with the fifth wiring (RS) 515, through the conductive film 1221. An insulating film 1283 is formed to protect the photodiode 520. Except for these points and the overlapping structure of the element such as the transistor and the photodiode 520, the configuration of the circuit in FIGS. 16A and 16B is similar to that of the pixel circuit 551 in FIGS. 15A and 15B.

Note that although a configuration in which the p-type semiconductor film 915 is directly electrically connected to the conductive film 1226 through the conductive film 1221 is shown as an example, another conductive film electrically connected to the conductive film 1226 through an opening formed in the insulating films 1281, 1282, and 1283 may be provided to be electrically connected to the conductive film 1221.

The overlapping structure of an element such as a transistor and a light-receiving element such as a photodiode as illustrated in FIGS. 16A and 16B can be applied to the circuit 552 illustrated in FIG. 3B, the circuits 553 and 554 illustrated in FIGS. 6A and 6B, the circuit 555 illustrated in FIG. 7, and the circuits illustrated in FIGS. 8A and 8B.

This embodiment can be implemented in appropriate combination with any of the structures described in the other embodiments.

(Embodiment 4)

In this embodiment, a transistor with an extremely low off-state current, which can be used for any of the circuits described in Embodiments 1 to 3, and a material for the transistor are described.

Figure 17A:
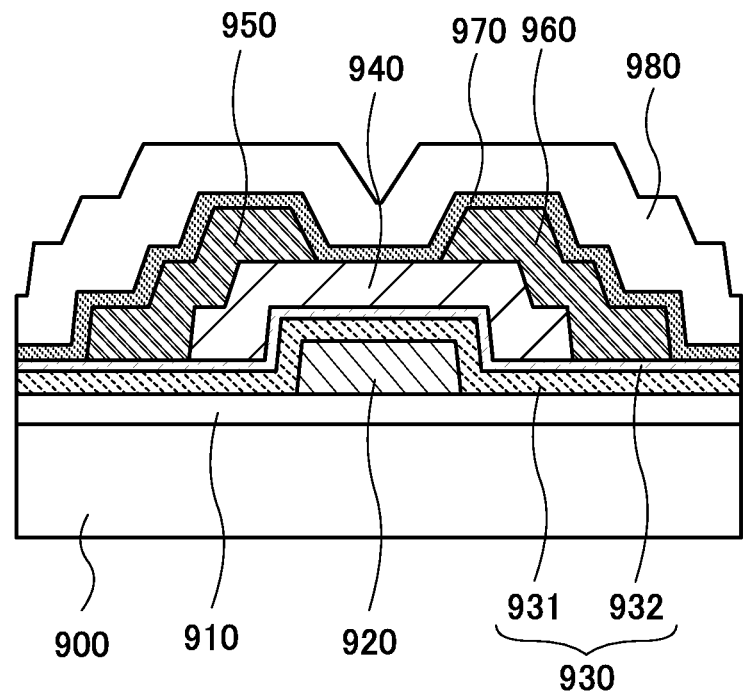
FIGS. 17A and 17B are cross-sectional views each illustrating a transistor.

FIG. 17A is a cross-sectional view of an example of a transistor that can be used in an imaging device of one embodiment of the present invention. The transistor includes a base insulating film 910 over a substrate 900, a gate electrode layer 920 over the base insulating film, a gate insulating film 930 including a first insulating film 931 and a second insulating film 932 in this order over the gate electrode layer, an oxide semiconductor layer 940 over the gate insulating film, and a source electrode layer 950 and a drain electrode layer 960 which are each in contact with part of the oxide semiconductor layer. An insulating layer 970 may be formed over the gate insulating film 930, the oxide semiconductor layer 940, the source electrode layer 950, and the drain electrode layer 960. In addition, an insulating layer 980 may be formed over the insulating layer.

Figure 17B:
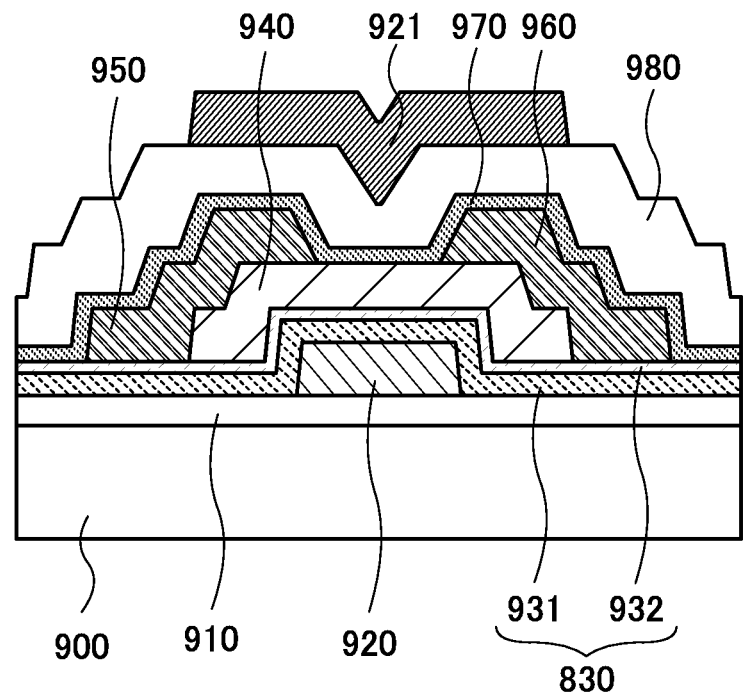

The transistor of one embodiment of the present invention may include, as illustrated in FIG. 17B, a conductive film 921 that overlaps with the gate electrode layer 920 and the oxide semiconductor layer 940 and is over the insulating layer 970 or the insulating layer 980. When the conductive film is used as a second gate electrode layer (back gate), the on-state current can be increased and the threshold voltage can be controlled. To increase the on-state current, for example, the gate electrode layer 920 and the conductive film 921 are set to have the same potential, and the transistor is driven as a dual-gate transistor. Further, to control the threshold voltage, a fixed potential that is different from a potential of the gate electrode layer 920 is supplied to the conductive film 921.

In an imaging device of one embodiment of the present invention, an oxide semiconductor is used in an active layer as described above. Because a transistor using an oxide semiconductor layer has higher mobility than a transistor using amorphous silicon, in the case of using an oxide semiconductor layer, miniaturization of the transistor can be easily achieved and thus the pixel size can be made smaller; in other words, the resolution of the imaging device can be increased.

A silicon nitride film can be used as the first insulating film 931 included in the gate insulating film 930. The thickness of the silicon nitride film is preferably 100 nm to 400 nm. A silicon oxide film can be used as the second insulating film 932 included in the gate insulating film 930. The thickness of the silicon oxide film is preferably 5 nm to 20 nm. The gate insulating film 930 formed using the above material to have the above thickness makes it possible to form a transistor whose electric characteristics are less fluctuated by irradiation with radiation such as X-rays.

Although a channel-etched bottom-gate structure is shown as an example in FIGS. 17A and 17B, a channel-protective bottom-gate structure, a non-self-aligned top-gate structure, or a self-aligned top-gate structure may be employed.

To form the transistor with an extremely low off-state current, a semiconductor material (e.g., oxide semiconductor) having a wider band gap than a silicon semiconductor and lower intrinsic carrier density than silicon is preferably used for the semiconductor layer.

As one example of the semiconductor material, a compound semiconductor such as silicon carbide (SiC) or gallium nitride (GaN) can be given in addition to an oxide semiconductor. The oxide semiconductor has an advantage of high mass productivity because the oxide semiconductor can be formed by a sputtering method or a wet process, unlike silicon carbide or gallium nitride. Further, the oxide semiconductor can be formed even at room temperature; thus, the oxide semiconductor can be formed over a glass substrate or over an integrated circuit using silicon. Further, a larger substrate can be used. Accordingly, among the semiconductors with wide band gaps, the oxide semiconductor particularly has an advantage of high mass productivity. Further, in the case where an oxide semiconductor with high crystallinity is to be obtained in order to improve the property of a transistor (e.g., field-effect mobility), the oxide semiconductor with crystallinity can be easily obtained by heat treatment at 250° C. to 800° C.

Further, the conductivity type of a highly purified oxide semiconductor (purified OS) obtained by reduction of impurities each of which serves as an electron donor (donor) and by reduction of oxygen vacancies is an i-type or a substantially i-type. Therefore, a transistor including the oxide semiconductor has a characteristic of an extremely low off-state current. Furthermore, the band gap of the oxide semiconductor is 2 eV or more, preferably 2.5 eV or more, further preferably 3 eV or more. With the use of an oxide semiconductor film which is highly purified by a sufficient decrease in the concentration of impurities such as moisture or hydrogen and reduction of oxygen vacancies, the off-state current of a transistor can be decreased.

In the oxide semiconductor layer, hydrogen, nitrogen, carbon, silicon, and a metal element other than main components are impurities. For example, hydrogen and nitrogen form donor levels to increase the carrier density. Silicon forms impurity levels in an oxide semiconductor layer. The impurity levels serve as traps and might cause deterioration of electrical characteristics of the transistor. It is preferable to reduce the concentration of the impurities in the oxide semiconductor layer and at interfaces with other layers.

Note that in order that a transistor in which an oxide semiconductor layer serves as a channel have stable electrical characteristics, it is effective to reduce the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

To make the oxide semiconductor layer intrinsic or substantially intrinsic, in SIMS (secondary ion mass spectrometry), for example, the concentration of silicon at a certain depth of the oxide semiconductor layer or in a region of the oxide semiconductor layer is lower than $1\times10^{19}$ atoms/$cm^3$, preferably lower than $5\times10^{18}$ atoms/$cm^3$, further preferably lower than $1\times10^{18}$ atoms/$cm^3$. Further, the concentration of hydrogen at a certain depth of the oxide semiconductor layer or in a region of the oxide semiconductor layer is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. Further, the concentration of nitrogen at a certain depth of the oxide semiconductor layer or in a region of the oxide semiconductor layer is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer is lower than $1 \times 10^{19}$ atoms/cm$^3$, preferably lower than $5 \times 10^{18}$ atoms/cm$^3$, further preferably lower than $1 \times 10^{18}$ atoms/cm$^3$. Further, the concentration of carbon at a certain depth of the oxide semiconductor layer or in a region of the oxide semiconductor layer is lower than $1 \times 10^{19}$ atoms/cm$^3$, preferably lower than $5 \times 10^{18}$ atoms/cm$^3$, further preferably lower than $1 \times 10^{18}$ atoms/cm$^3$, for example.

Specifically, various experiments can prove a low off-state current of a transistor including a channel formation region formed of a highly purified oxide semiconductor film. For example, even when an element has a channel width of $1 \times 10^6$ μm and a channel length of 10 μm, off-state current can be lower than or equal to the measurement limit of a semiconductor parameter analyzer, i.e., lower than or equal to $1 \times 10^{-13}$ A, at voltage (drain voltage) between a source electrode and a drain electrode of from 1 V to 10 V. In this case, it can be seen that the off-state current standardized on the channel width of the transistor is lower than or equal to 100 zA/μm. In addition, a capacitor and a transistor are connected to each other and the off-state current is measured with a circuit in which electrical charges flowing into or from the capacitor is controlled by the transistor. In the measurement, a purified oxide semiconductor film has been used for a channel formation region of the transistor, and the off-state current of the transistor has been measured from a change in the number of electrical charges of the capacitor per unit time. As a result, it is found that in the case where the voltage between the source electrode and the drain electrode of the transistor is 3 V, a lower off-state current of several tens of yoctoamperes per micrometer (yA/μm) can be obtained. Accordingly, the off-state current of the transistor including a channel formation region formed of the highly purified oxide semiconductor film is considerably lower than that of a transistor including silicon having crystallinity.

Note that the oxide semiconductor preferably contains at least indium (In) or zinc (Zn). In particular, In and Zn are preferably contained. In addition, as a stabilizer for reducing the variation in electrical characteristics of a transistor using the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or more of lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. The above oxide semiconductors may include silicon.

Note that an In—Ga—Zn-based oxide, for example, means an oxide containing In, Ga, and Zn, and there is no limitation on the ratio of In, Ga, and Zn. The In—Ga—Zn-based oxide may contain a metal element other than In, Ga, and Zn. The In—Ga—Zn-based oxide has sufficiently high resistance when there is no electric field and thus off-state current can be sufficiently reduced. In addition, also having high field-effect mobility, the In—Ga—Zn-based oxide is suitable for a semiconductor material used in a semiconductor device.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition may be used depending on needed electrical characteristics (such as mobility and threshold voltage). Further, it is preferable to appropriately set the carrier density, the impurity concentration, the defect density, the atomic ratio of a metal element and oxygen, the interatomic distance, the density, or the like in order to obtain necessary semiconductor characteristics.

For example, the oxide semiconductor film can be formed by a sputtering method using a target containing indium (In), gallium (Ga), and zinc (Zn). In the case where an In—Ga—Zn-based oxide semiconductor film is formed by a sputtering method, it is preferable to use a target of an In—Ga—Zn-based oxide with an atomic ratio of In:Ga:Zn=1:1:1, 5:5:6, 4:2:3, 3:1:2, 1:1:2, 2:1:3, 1:3:2, 1:3:4, 1:6:4, or 3:1:4. When the oxide semiconductor film is formed using an In—Ga—Zn-based oxide target having the aforementioned atomic ratio, a crystal is readily formed. The filling rate of the target containing In, Ga, and Zn is 90% or higher, preferably 95% or higher. With the use of the target with high filling rate, a dense oxide semiconductor film is formed.

In the case where an In—Zn-based oxide material is used as an oxide semiconductor, a target of the In—Zn-based oxide has a composition ratio of In:Zn=50:1 to 1:2 in an atomic ratio (In$_2$O$_3$:ZnO=25:1 to 1:4 in a molar ratio), preferably In:Zn=20:1 to 1:1 in an atomic ratio (In$_2$O$_3$:ZnO=10:1 to 1:2 in a molar ratio), further preferably In:Zn=1.5:1 to 15:1 in an atomic ratio (In$_2$O$_3$:ZnO=3:4 to 15:2 in a molar ratio). For example, in a target used for formation of an oxide semiconductor film including an In—Zn-based oxide which has an atomic ratio of In:Zn:O=X:Y:Z, the relation of Z>1.5X+Y is satisfied. The mobility can be improved by keeping the ratio of Zn within the above range.

In the case of forming an In—Sn—Zn-based oxide semiconductor film as the oxide semiconductor film by a sputtering method, it is preferred to use an In—Sn—Zn—O target containing In, Sn, and Zn at an atomic ratio of 1:1:1, 2:1:3, 1:2:2, or 20:45:35.

A structure of the oxide semiconductor film is described below.

Note that in this specification, a term "parallel" indicates that the angle formed between two straight lines is greater than or equal to −10° and less than or equal to 10°, and is accordingly used to express the case where the angle is greater than or equal to −5° and less than or equal to 5°. In addition, a term "perpendicular" indicates that the angle formed between two straight lines is greater than or equal to 80° and less than or equal to 100°, and is accordingly used to express the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a crystal grain boundary is not clearly observed. Thus, in the CAAC-OS film, a reduction in electron mobility due to the crystal grain boundary is unlikely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is assigned to the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is assigned to the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are assigned to crystal planes equivalent to the (110) plane. In contrast, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of the top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of the top surface of the CAAC-OS film. Thus, for example, in the case where a shape of the CAAC-OS film is changed by etching or the like, the c-axis might not be necessarily parallel to a normal vector of a formation surface or a normal vector of the top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film with a low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and has high reliability. It takes a long time for electrical charges trapped by the carrier traps in the oxide semiconductor film to be released, and might behave like fixed electrical charges. Thus, the transistor which includes the oxide semiconductor film having a high impurity concentration and a high density of defect states has unstable electrical characteristics in some cases.

With use of the CAAC-OS film in a transistor, a variation in electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, the size of a crystal part in the microcrystalline oxide semiconductor film is greater than or equal to 1 nm and less than or equal to 100 nm, or greater than or equal to 1 nm and less than or equal to 10 nm. An oxide semiconductor film including nanocrystal (nc), which is a microcrystal with a size greater than or equal to 1 nm and less than or equal to 10 nm, or a size greater than or equal to 1 nm and less than or equal to 3 nm, is specifically referred to as a nanocrystalline oxide semiconductor (nc-OS) film. In an image of the nc-OS film which is obtained with the TEM, for example, a crystal grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order in some cases. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction pattern) of the nc-OS film obtained by using an electron beam having a diameter (e.g., larger than or equal to 50 nm) larger than that of a crystal part. Meanwhile, spots are shown in a nanobeam electron diffraction pattern of the nc-OS film obtained by using an electron beam having a diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that the oxide semiconductor film may be a stacked film including two or more films of an amorphous oxide semiconductor film, a microcrystalline oxide semiconductor film, and a CAAC-OS film, for example.

For example, the CAAC-OS film is formed by a sputtering method using a polycrystalline oxide semiconductor sputtering target. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like or pellet-like sputtered particle reaches a substrate while maintaining its crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature is higher than or equal to 100° C. and lower than or equal to 740° C., preferably higher than or equal to 200° C. and lower than or equal to 500° C. When the substrate heating temperature during the deposition is increased and the flat-plate-like or pellet-like sputtered particle reaches the substrate, migration occurs over the substrate, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As a sputtering target, an In—Ga—Zn—O compound target can be used, for example. The In—Ga—Zn—O compound target is a polycrystalline body that is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. The grain size of the polycrystalline body is preferably as small as possible, for example, less than or equal to 1 μm. The kinds of powder and the molar ratio for mixing powder may be determined as appropriate depending on the desired sputtering target.

Figure 18A:
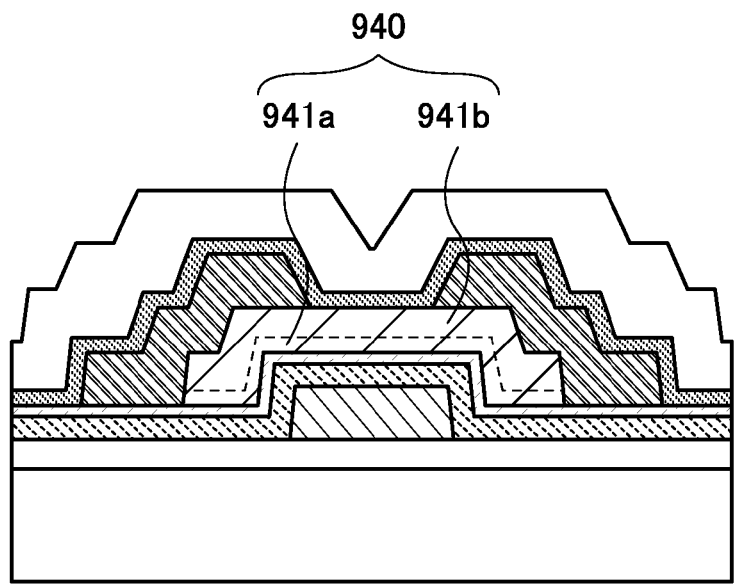
FIGS. 18A and 18B are cross-sectional views each illustrating a transistor.

The oxide semiconductor film may include a plurality of oxide semiconductor films stacked. For example, as in a transistor illustrated in FIG. 18A, stacked layers of a first oxide semiconductor film 941a and a second oxide semiconductor film 941b may constitute the oxide semiconductor layer 940. The first oxide semiconductor film 941a and the second oxide semiconductor film 941b may include metal oxides having different atomic ratios. For example, one of the oxide semiconductor films may be formed using one of an oxide containing two kinds of metals, an oxide containing three kinds of metals, and an oxide containing four kinds of metals, and the other of the oxide semiconductor films may be formed using one of the above which is different from the oxide used for the one oxide semiconductor film.

Alternatively, the first oxide semiconductor film 941a and the second oxide semiconductor film 941b may include the same constituent elements with different atomic ratios. For example, one of the oxide semiconductor films may contain In, Ga, and Zn at an atomic ratio of 1:1:1, 5:5:6, or 3:1:2, and the other of the oxide semiconductor films may contain In, Ga, and Zn at an atomic ratio of 1:3:2, 1:3:4, 1:3:6, 1:6:4, or 1:9:6. Note that the proportion of each atom in the atomic ratio of the oxide semiconductor film may vary within a range of ±20% as an error.

In the above, one of the first oxide semiconductor film and the second oxide semiconductor film, which is closer to the gate electrode than the other (the oxide semiconductor film on the channel side), has an atomic ratio of In≥Ga; and the other oxide semiconductor film, which is farther from the gate electrode (the oxide semiconductor film on the back channel side), has an atomic ratio of In<Ga. In that case, a transistor with high field-effect mobility can be manufactured. In contrast, when the oxide semiconductor film on the channel side has an atomic ratio of In<Ga and the oxide semiconductor film on the back channel side has an atomic ratio of In≥Ga, it is possible to reduce the amount of change in the threshold voltage of a transistor due to change over time or a reliability test.

Further alternatively, the semiconductor film of the transistor may have a three-layer structure of a first oxide semiconductor film, a second oxide semiconductor film, and a third oxide semiconductor film. In that case, the first to third oxide semiconductor films may include the same constituent elements with different atomic ratios. A transistor including a three-layer semiconductor film will be described with reference to FIG. 18B.

Figure 18B:
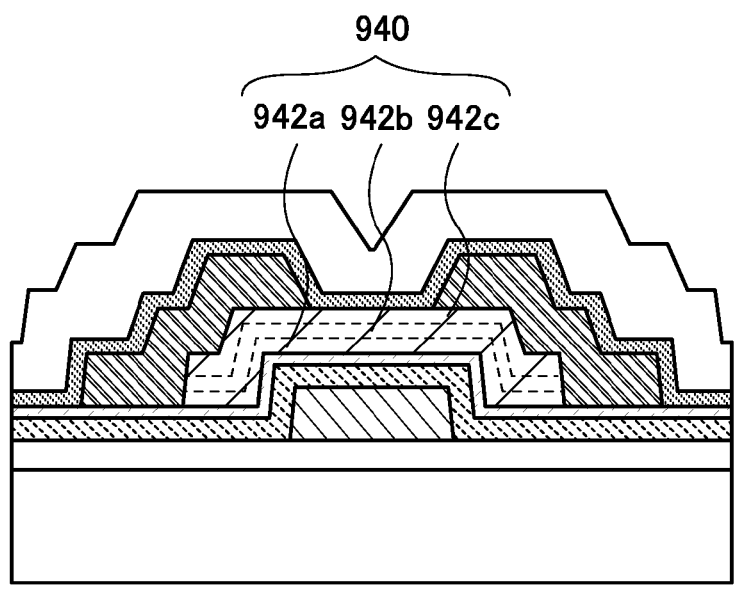

The transistor illustrated in FIG. 18B includes a first oxide semiconductor film 942a, a second oxide semiconductor film 942b, and a third oxide semiconductor film 942c which are stacked in this order from the gate insulating film side.

The first oxide semiconductor film 942a and the third oxide semiconductor film 942c are formed using a material represented by $InM_{1x}Zn_yO_z$ (x≥1, y>1, z>0, $M_1$=Ga, Hf, or the like). The second oxide semiconductor film 942b is formed using a material which can be represented by $InM_{2x}Zn_yO_z$ (x≥1, y≥x, z>0, $M_2$=Ga, Sn, or the like).

Materials of the first to third oxide semiconductor films 942a to 942c are selected as appropriate so as to form a well-shaped structure in which the conduction band minimum in the second oxide semiconductor film 942b is deeper from the vacuum level than the conduction band minimum in the first and third oxide semiconductor films 942a and 942c.

For example, the first oxide semiconductor film 942a and the third oxide semiconductor film 942c may each have an atomic ratio of In:Ga:Zn=1:3:2, 1:3:4, 1:3:6, 1:6:4, or 1:9:6; the second oxide semiconductor film 942b may have an atomic ratio of In:Ga:Zn=1:1:1, 5:5:6, or 3:1:2.

Since the first to third oxide semiconductor films 942a to 942c include the same constituent elements, the second oxide semiconductor film 942b has few defect states (trap levels) at the interface with the first oxide semiconductor film 942a. Specifically, the defect states (trap levels) are fewer than those at the interface between the gate insulating film and the first oxide semiconductor film 942a. For this reason, when the oxide semiconductor films are stacked in the above manner, the amount of change in the threshold voltage of a transistor due to a change over time or a reliability test can be reduced.

Further, materials of the first to third oxide semiconductor films are selected as appropriate so as to form a well-shaped structure in which the conduction band minimum in the second oxide semiconductor film 942b is deeper from the vacuum level than the conduction band minimum in the first and third oxide semiconductor films 942a and 942c. As a result, the field-effect mobility of the transistor can be increased and the amount of change in the threshold voltage of the transistor due to change over time or a reliability test can be reduced.

Further, the first to third oxide semiconductor films 942a to 942c may be formed using oxide semiconductors having different crystallinities. That is, the first to third oxide semiconductor films may be formed using a combination of any of a single crystal oxide semiconductor, a polycrystalline oxide semiconductor, a microcrystalline (nanocrystalline) oxide semiconductor, an amorphous oxide semiconductor, and a CAAC-OS film.

At least the second oxide semiconductor film 942b, which can serve as a channel formation region, is preferably a CAAC-OS film.

When the oxide semiconductor film is in contact with a conductive material which is easily bonded to oxygen (e.g., a metal used for the source electrode or the drain electrode), oxygen in the oxide semiconductor film is diffused into the conductive material which is easily bonded to oxygen. Such a phenomenon occurs more frequently as the temperature is raised. Some heating steps are included in the manufacturing process of the transistor; thus, owing to the phenomenon, oxygen vacancies are generated in and around the region of the oxide semiconductor layer which is in contact with the source electrode or the drain electrode, so that the region becomes an n-type region. Accordingly, the n-type region can serve as a source or drain of the transistor.

This embodiment can be implemented in appropriate combination with any of the structures described in the other embodiments.

This application is based on Japanese Patent Application serial no. 2013-161035 filed with Japan Patent Office on Aug. 2, 2013, the entire contents of which are hereby incorporated by reference.

What is claimed is:

1. A semiconductor device comprising:
   a pixel circuit comprising a transistor and a light-receiving element, wherein a gate of the transistor is electrically connected to a charge accumulation portion and a potential of the charge accumulation portion is determined according to intensity of light received by the light-receiving element; and
   a memory circuit portion comprising a first look-up table and a second look-up table,
   wherein the first look-up table is configured to store data of potentials of the charge accumulation portion, which depends on the intensity of light, and
   wherein the second look-up table is configured to store output data of the transistor, which depends on the potentials of the charge accumulation portion.

2. The semiconductor device according to claim 1, further comprising a current detection circuit and an A/D converter, wherein the output data is input to the second look-up table through the current detection circuit and the A/D converter.

3. The semiconductor device according to claim 1, wherein the memory circuit portion is configured to acquire data of the second look-up table.

4. The semiconductor device according to claim 1, further comprising a scintillator over the pixel circuit.

5. The semiconductor device according to claim 1, wherein the light-receiving element is a photodiode.

6. The semiconductor device according to claim 1, wherein the light-receiving element is a variable resistive element including a semiconductor layer between a pair of electrodes.

7. An operation method of the semiconductor device according to claim 1, the operation method comprising the steps of:
acquiring data of the second look-up table;
estimating the potential of the charge accumulation portion at imaging on the basis of the output data of the transistor and the data of the second look-up table; and
estimating the intensity of the light from the estimated potential of the charge accumulation portion and the data of the first look-up table.

8. The operation method according to claim 7, further comprising the step of:
inputting a signal regarding the estimated intensity of the light into the memory circuit portion.

9. The semiconductor device according to claim 1, wherein the transistor includes an oxide semiconductor region.

10. A semiconductor device comprising:
a pixel circuit comprising a first transistor, a second transistor, a third transistor, and a light-receiving element, wherein a gate of the second transistor is electrically connected to a charge accumulation portion and a potential of the charge accumulation portion is determined according to intensity of light received by the light-receiving element; and
a memory circuit portion comprising a first look-up table and a second look-up table,
wherein the first look-up table is configured to store data of potentials of the charge accumulation portion, which depends on the intensity of light,
wherein the second look-up table is configured to store output data of the second transistor, which depends on the potentials of the charge accumulation portion,
wherein one of a source and a drain of the first transistor is electrically connected to one electrode of the light-receiving element,
wherein the other of the source and the drain of the first transistor is electrically connected to the charge accumulation portion,
wherein one of a source and a drain of the second transistor is electrically connected to one of a source and a drain of the third transistor,
wherein the other of the source and the drain of the second transistor is electrically connected to a first wiring,
wherein the other of the source and the drain of the third transistor is electrically connected to a second wiring,
wherein a gate of the first transistor is electrically connected to a third wiring,
wherein a gate of the third transistor is electrically connected to a fourth wiring, and
wherein the other electrode of the light-receiving element is electrically connected to a fifth wiring.

11. The semiconductor device according to claim 10, further comprising a current detection circuit and an A/D converter,
wherein the output data is input to the second look-up table through the current detection circuit and the A/D converter.

12. The semiconductor device according to claim 10, wherein the memory circuit portion is configured to acquire data of the second look-up table.

13. The semiconductor device according to claim 10, further comprising a scintillator over the pixel circuit.

14. The semiconductor device according to claim 10, wherein the light-receiving element is a photodiode.

15. The semiconductor device according to claim 10, wherein the light-receiving element is a variable resistive element including a semiconductor layer between a pair of electrodes.

16. An operation method of the semiconductor device according to claim 10, the operation method comprising the steps of:
acquiring data of the second look-up table;
estimating the potential of the charge accumulation portion at imaging on the basis of the output data of the second transistor and the data of the second look-up table; and
estimating the intensity of the light from the estimated potential of the charge accumulation portion and the data of the first look-up table.

17. The operation method according to claim 16, further comprising the step of:
inputting a signal regarding the estimated intensity of the light into the memory circuit portion.

18. The semiconductor device according to claim 10, wherein each of the first transistor, the second transistor, and the third transistor includes an oxide semiconductor region.

19. A semiconductor device comprising:
a pixel circuit comprising a first transistor, a second transistor, a third transistor, a fourth transistor, and a light-receiving element, wherein a gate of the second transistor is electrically connected to a charge accumulation portion and a potential of the charge accumulation portion is determined according to intensity of light received by the light-receiving element; and
a memory circuit portion comprising a first look-up table and a second look-up table,
wherein the first look-up table is configured to store data of potentials of the charge accumulation portion, which depends on the intensity of light,
wherein the second look-up table is configured to store output data of the second transistor, which depends on the potentials of the charge accumulation portion,
wherein one of a source and a drain of the first transistor is electrically connected to one electrode of the light-receiving element,
wherein the other of the source and the drain of the first transistor is electrically connected to the charge accumulation portion,
wherein one of a source and a drain of the second transistor is electrically connected to one of a source and a drain of the third transistor,
wherein one of a source and a drain of the fourth transistor is electrically connected to the charge accumulation portion,
wherein the other of the source and the drain of the second transistor is electrically connected to a first wiring,
wherein the other of the source and the drain of the third transistor is electrically connected to a second wiring,
wherein the other of the source and the drain of the fourth transistor is electrically connected to a seventh wiring,
wherein a gate of the first transistor is electrically connected to a third wiring, wherein a gate of the third transistor is electrically connected to a fourth wiring, wherein a gate of the fourth transistor is electrically connected to a fifth wiring, and wherein the other electrode of the light-receiving element is electrically connected to a sixth wiring.

20. The semiconductor device according to claim 19, further comprising a current detection circuit and an A/D converter, wherein the output data is input to the second look-up table through the current detection circuit and the A/D converter.

21. The semiconductor device according to claim 19, wherein the memory circuit portion is configured to acquire data of the second look-up table.

22. The semiconductor device according to claim 19, further comprising a scintillator over the pixel circuit.

23. The semiconductor device according to claim 19, wherein the light-receiving element is a photodiode.

24. The semiconductor device according to claim 19, wherein the light-receiving element is a variable resistive element including a semiconductor layer between a pair of electrodes.

25. An operation method of the semiconductor device according to claim 19, the operation method comprising the steps of:

acquiring data of the second look-up table;

estimating the potential of the charge accumulation portion at imaging on the basis of the output data of the second transistor and the data of the second look-up table; and estimating the intensity of the light from the estimated potential of the charge accumulation portion and the data of the first look-up table.

26. The operation method according to claim 25, further comprising the step of:

inputting a signal regarding the estimated intensity of the light into the memory circuit portion.

27. The semiconductor device according to claim 19, wherein each of the first transistor, the second transistor, the third transistor, and the fourth transistor includes an oxide semiconductor region.

* * * * *